United States Patent
Kumata et al.

[11] Patent Number: 5,883,529
[45] Date of Patent: Mar. 16, 1999

[54] FUNCTION CLOCK GENERATION CIRCUIT AND D-TYPE FLIP-FLOP EQUIPPED WITH ENABLE FUNCTION AND MEMORY CIRCUIT USING SAME

[75] Inventors: Ichiro Kumata; Masatoshi Aikawa, both of Kanagawa, Japan

[73] Assignee: Sony Corporation, Japan

[21] Appl. No.: 834,146

[22] Filed: Apr. 14, 1997

[30] Foreign Application Priority Data

Apr. 19, 1996 [JP] Japan ................................ 8-098907

[51] Int. Cl.⁶ ............................ H03K 19/00; H03K 5/01; G06F 1/04
[52] U.S. Cl. .............................. 326/93; 326/83; 326/98; 327/166; 327/298
[58] Field of Search ................................ 326/83, 57, 58, 326/93, 98; 327/166, 298, 299

[56] References Cited

U.S. PATENT DOCUMENTS

| | | | |
|---|---|---|---|
| 5,254,888 | 10/1993 | Lee et al. | 327/299 |
| 5,453,708 | 9/1995 | Gupta et al. | 326/98 |
| 5,619,157 | 4/1997 | Kumata et al. | 327/203 |
| 5,652,536 | 6/1997 | Nookala et al. | 327/298 |

FOREIGN PATENT DOCUMENTS

| | | | |
|---|---|---|---|
| 000382233 | 8/1990 | European Pat. Off. | 327/298 |
| 403213010 | 9/1991 | Japan | 327/298 |

*Primary Examiner*—Michael Tokar
*Assistant Examiner*—Daniel D. Chang
*Attorney, Agent, or Firm*—Ronald P. Kananen; Rader, Fishman & Grauer

[57] ABSTRACT

It is to realize a function clock generation circuit with which a wiring area and cell area, and further a power consumption can be reduced, and a timing design is easy. An input terminal D of a through latch circuit LTC11 is connected to an input line of an enable signal EN, an inversion clock input terminal G is connected to the input line of the clock signal, one input terminal of a NAND gate NAND11 is connected to an output terminal Q of a through latch circuit LTC11, the other input terminal is connected to the input terminal of the clock signal CK, and the output terminal is connected to the input terminal of an inverter INV11. Then, in the through latch circuit LTC11, the enable signal EN is sampled at the rising edge of the clock signal CK, and according to the value, the clock pulse immediately after the sampling is passed or blocked by the logical gate LGT comprising a NAND gate NAND11 and an inverter INV11.

19 Claims, 27 Drawing Sheets

PRIOR ART

PRIOR ART

PRIOR ART

PRIOR ART

FUNCTION CLOCK GENERATION CIRCUIT AND D-TYPE FLIP-FLOP EQUIPPED WITH ENABLE FUNCTION AND MEMORY CIRCUIT USING SAME

BACKGROUND OF THE INVENTION

1. Field of the Invention

The present invention relates to a function clock (gated clock) signal generation circuit of, for example, a synchronous D-type flip-flop equipped with an enable function useful for reduction of the area of a E large-scale integrated circuit (LSI) of a complementary metal oxide semiconductor (CMOS) and reduction of the power consumption and to a D-type flip-flop equipped with an enable function and a memory circuit using the same.

2. Description of the Related Art

The increasingly larger size and complexity of LSIs means that a single type of clock is no longer sufficient. There is therefore a growing need for use of a plurality of clocks in a single chip.

The reason why a plurality of clocks are used is that, in general, the contents of the processing of different blocks are different. In recent large-scale high performance LSIs, however, in addition to this, the increase of the power consumption has become a serious problem. As one of the measures taken against this, useless operations are being reduced by using a large number of function clocks optimum for the processing of the blocks.

Below, an explanation will be made of a case where use is made not a plurality of clocks having a completely asynchronous relationship, but a plurality of clocks which are prepared by frequency division of an original clock and by clock pulse selection and which are synchronized with the original clock.

As examples of the related art where such a plurality of clocks are necessary, there is the system for generation of a function clock by a gate, a system using a D-type flip-flop equipped with an enable function which makes an equivalent operation to that of the case using a plurality of clocks be performed by using a single single-phase clock and a D-type flip-flop equipped with an enable function, and a system for generation of a function clock which samples an enable signal once by a D-type flip-flop and then generates a function clock by using a gate.

With these related arts, however, as will be explained in detail later with reference to the drawings, there are the problems of a large interconnection area and cell area, a large power consumption, and difficult design of timing in the function clock generation circuit and in the D-type flip-flop equipped with an enable function and the memory circuit using the same.

SUMMARY OF THE INVENTION

The present invention was made in consideration with such a circumstance and has as an object thereof to provide a function clock generation circuit with which the interconnection area and cell area and further the power consumption can be reduced and the design of the timing can be facilitated and a D-type flip-flop equipped with an enable function and a memory circuit using this.

To achieve the above object, according to a first aspect of the present invention, there is provided a function clock generation circuit which has a through latch for outputting an enable signal as it is when a clock signal is in a second state and outputting a value of the enable signal of the point of time immediately before the clock signal changes from the second state to a first state when the clock signal is in the first state and a logical gate for outputting a function clock of the second state only when the output signal of the through latch is in the first state and the clock signal is in the first state and outputting a function clock of the first state when the output signal of the through latch is in the second state and the clock signal is in the first state or when the output signal of the through latch is in the second state and the clock signal is in the second state.

Preferably, the through latch is constituted by a dynamic type latch.

Preferably, the circuit has a clock pulse width limiting circuit for limiting the maximum value of the clock pulse width of the clock signal and supplying this to the through latch and logical gate.

According to a second aspect of the present invention, there is provided a function clock generation circuit having a dynamic type through latch provided with a transfer gate for transferring an enable signal to a first node only when a clock signal is in a first state and a logical gate provided with a first means for connecting a second node to a first power source when the clock signal is in the first state and a second means for connecting the second node to a second power source only when the clock signal is in a second state and the signal of the first node is in the second state.

Preferably, the circuit also has a clock pulse width limiting circuit for limiting the maximum value of the clock pulse width of the clock signal and supplying this to the through latch and logical gate.

According to a third aspect of the present invention, there is provided a D-type flip-flop equipped with an enable function comprising a function clock generation circuit of the first aspect of the invention with an output terminal of a function clock at a logical gate thereof connected to a clock input terminal of at least one D-type flip-flop.

Preferably, the D-type flip-flop is constituted by connecting a dynamic type latch and a static type latch in cascade.

According to a fourth aspect of the present invention, there is provided a D-type flip-flop equipped with an enable function comprising a function clock generation circuit of the second preferred mode of the first aspect of the invention with an output terminal of a function clock at a logical gate thereof connected to a clock input terminal of at least one D-type flip-flop.

Preferably, the D-type flip-flop is constituted by connecting a dynamic type latch and a static type latch in cascade.

According to a fifth aspect of the present invention, there is provided a memory circuit equipped with an enable function comprising a function clock generation circuit of the first aspect of the invention with an output terminal of a function clock at a logical gate thereof connected to a clock input terminal of at least one memory circuit having a clock input.

According to the function clock generation circuit of the present invention, it is possible to sample the enable signal by a rising edge portion of the clock signal and pass or block the clock pulse immediately after this in a short delay time.

Further, by using this function clock generation circuit, it becomes possible to easily replace a circuit using a single single-phase clock and D-type flip-flop equipped with an enable function which has been conventionally frequently used by an equivalent circuit using a function clock and reduce the interconnection area and cell area and further the power consumption.

Further, by using this function clock generation circuit, a memory circuit with an enable function can be, realized by a smaller number of transistors.

BRIEF DESCRIPTION OF THE DRAWINGS

These and other objects and features of the present invention will become clearer from the following more detailed description of the related art and description of the preferred embodiments given with reference to the attached figures, in which.

DESCRIPTION OF THE PREFERRED EMBODIMENTS

Before explaining the preferred embodiments of the present invention, a more detailed explanation will be made of the related art with reference to the drawings.

First, an explanation will be made of the system for generation of a function clock by a gate by referring to FIG. 1 and FIG. 2.

Figure 1:
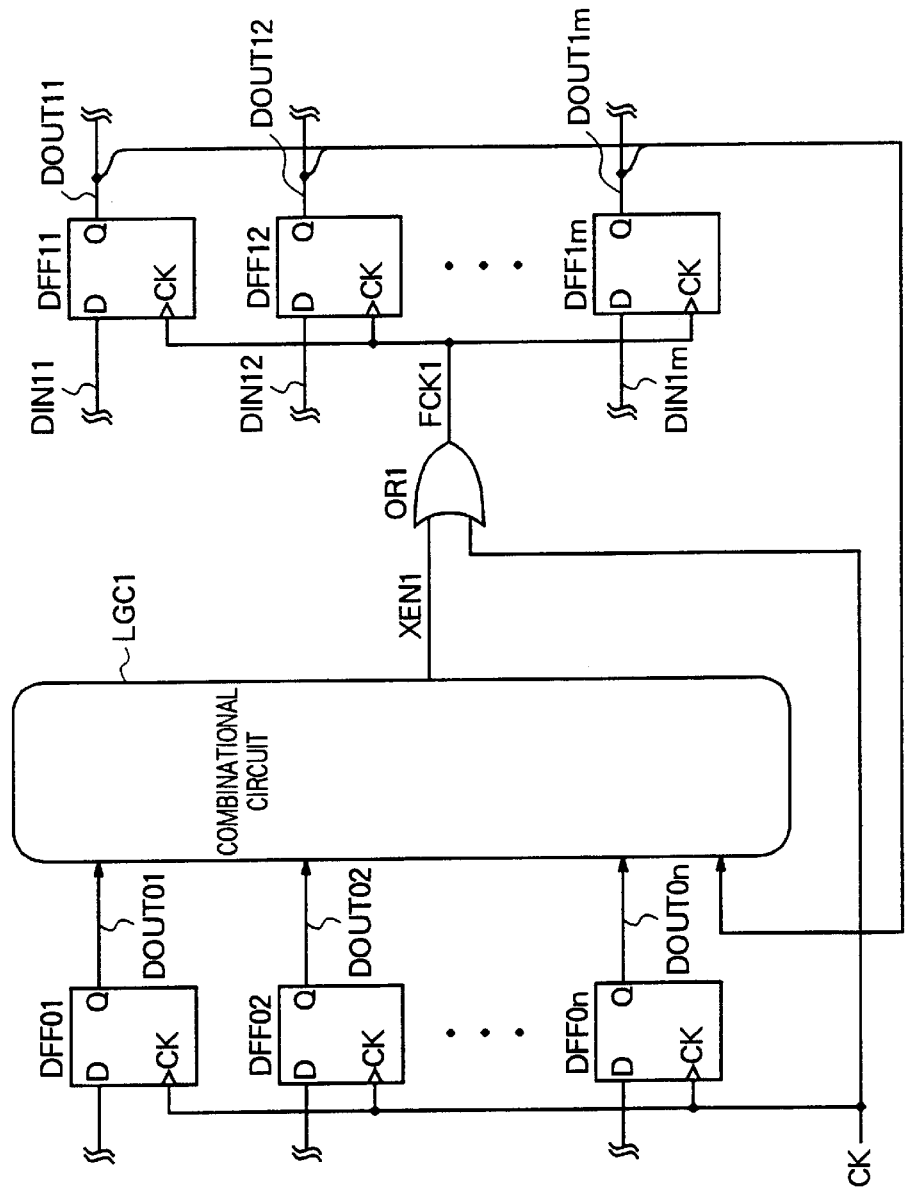
FIG. 1 is a circuit diagram of an example of the configuration of a function clock generation circuit adopting a system of generation of a function clock using a gate according to the related art.
Figure 2:
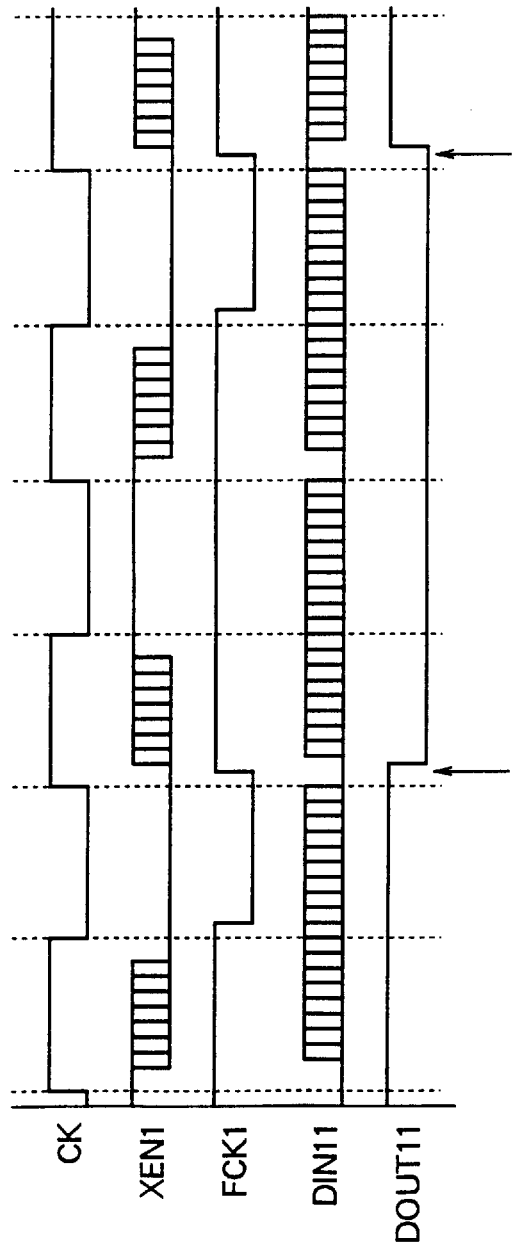
FIG. 2 is a timing chart of signals of the circuit of FIG. 1.

FIG. 1 is a circuit diagram of an example of the configuration of a function clock generation circuit adopting the system of generation of a function clock by a gate; and FIG. 2 is a timing chart of signals of FIG. 1.

In this circuit, outputs of D-type flip-flops DFF01 to DFF0n and DFF11 to DFF1m are processed at a combinational circuit LGC1 to generate a negative logical enable signal XEN1.

This negative logical enable signal XEN1 is input to an OR gate OR1, where a logical OR with the clock signal CK is taken. The clock pulse is thereby passed or blocked by the negative logic enable signal XEN1 to generate a function clock (gated clock) FCK1.

The thus generated function clock FCK1 is used as the clock of the D-type flip-flops DFF11, DFF21, DFFm1, etc. at a later stage.

Further, as seen from FIG. 2, the pulse of the original clock signal CK may be selectively passed or blocked by the negative logic enable signal XEN1 to generate the function clock FCK1 and intermittently operate the D-type flip-flops DFF11 to DFF1m receiving as their inputs the function clock FCK1.

Next, an explanation will be made of an example of the system of using a D-type flip-flop equipped with an enable function by referring to FIG. 3 and FIG. 4.

Figure 3:
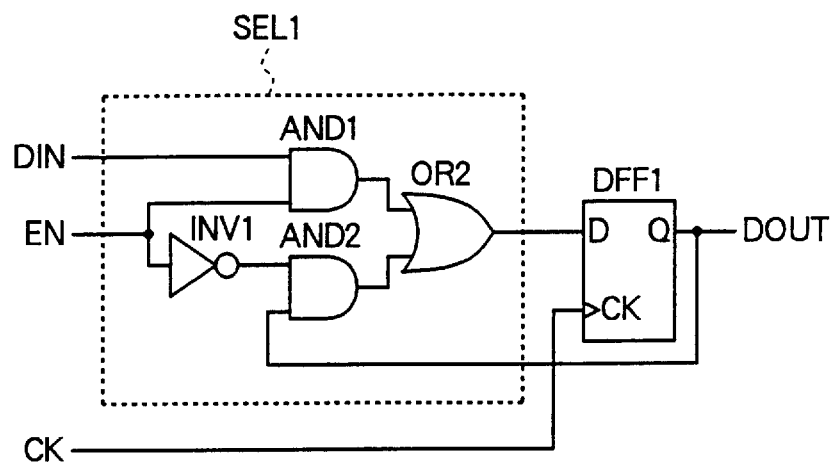
FIG. 3 is a circuit diagram of an example of the configuration of a function clock generation circuit adopting a system using a D-type flip-flop equipped with an enable function according to the related art.
Figure 4:
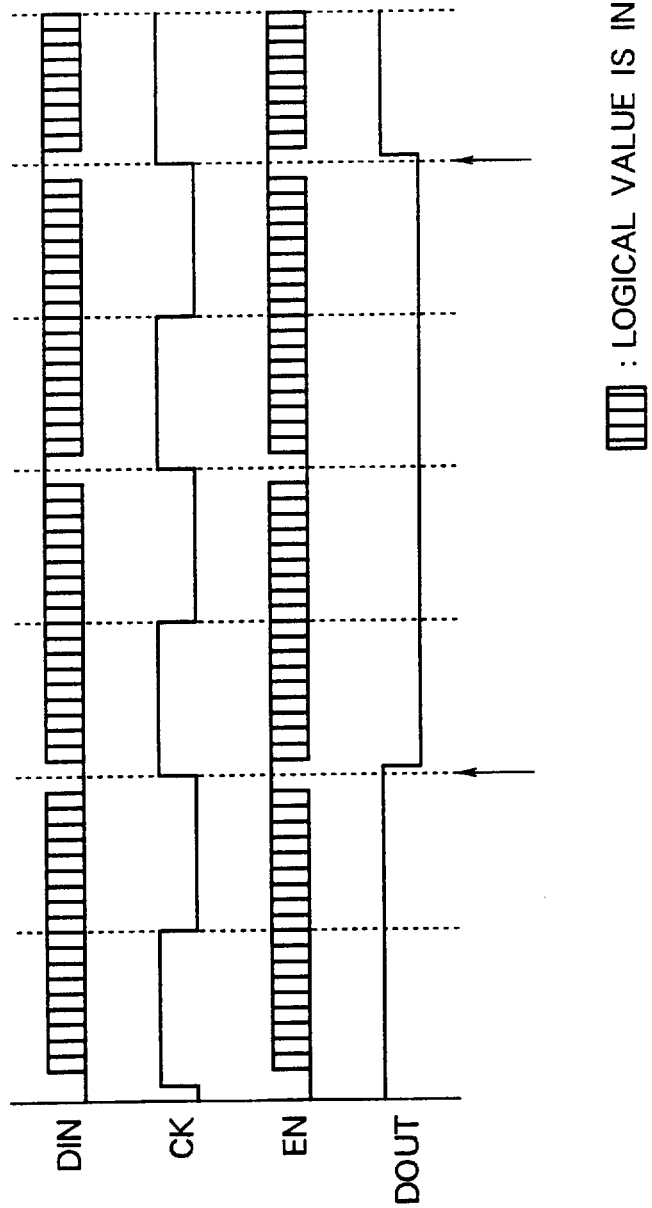
FIG. 4 is a timing chart of the signals of the circuit of FIG. 3.

FIG. 3 is a circuit diagram of an example of the configuration of a D-type flip-flop equipped with an enable function; and FIG. 4 is a timing chart of signals of FIG. 3.

The D-type flip-flop equipped with an enable function has an enable terminal in addition to the input terminal D of a usual D-type flip-flop DFF1.

Namely, in a D-type flip-flop equipped with an enable function, as shown in FIG. 3, a selector SEL1 is arranged in front of the data input terminal D of the D-type flip-flop DFF1.

The selector SEL1 is constituted by a 2-input AND gate AND1 having one input terminal connected to an input line of a data input signal DIN and the other input terminal connected to the input line of the enable signal EN, a 2-input AND gate AND2 having one input terminal connected to the input line of the enable signal EN via an inverter INV1 and the other input terminal connected to an output terminal Q of the D-type flip-flop DFF1, and a 2-input OR gate OR2 having one input terminal connected to the output terminals of the AND gates AND1 and AND2 and the output terminal connected to an input terminal D of the D-type flip-flop DFF1.

In a selector SEL1 having such a configuration, one of the data input signal DIN and the output signal DOUT of the D-type flip-flop DFF1 is selected by the enable signal EN. The result thereof is fetched at the time of rising of the clock signal CK at the D-type flip-flop DFF1.

More specifically, when the enable signal EN is at a low level, the D-type flip-flop DFF1 fetches its own output signal DOUT at that point of time through the selector SEL1, therefore the previous value is held as the result.

When the enable signal EN is at a high level, the data input signal DIN is fetched from the outside.

Namely, the D-type flip-flop DFF1 equipped with an enable function samples the enable signal EN at the rising edge of the clock CK as shown in FIG. 4 and fetches the data input signal DIN only when that value is true.

Figure 5:
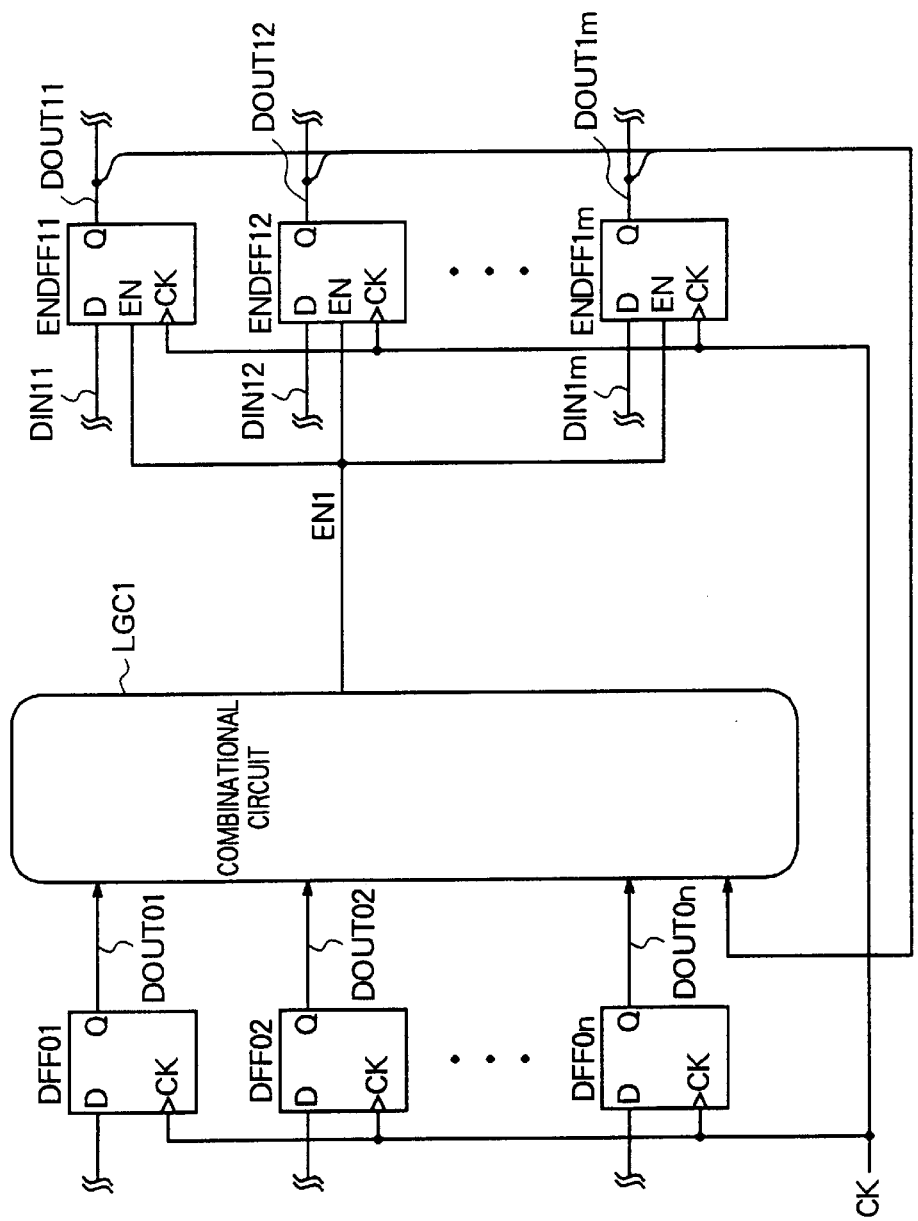
FIG. 5 is a circuit diagram of an example of a configuration in which a data fetching operation of a D-type flip-flop is realized in only a certain clock cycle selected by using a D-type flip-flop equipped with an enable function according to the related art.

Note that, where it is desired to perform the data fetching operation of the D-type flip-flop in only a certain selected clock cycle, this can be realized as shown in for example FIG. 5 by using a D-type flip-flop equipped with an enable function as explained above.

In FIG. 5, DFF01 to DFF0n indicate usual D-type flip-flops, LGC1 indicates a combinational circuit, and ENDFF11 to ENDFF1m indicate D-type flip-flops equipped with enable functions.

In this system, the clock signals are standardized as a single single-phase clock, and the enable signal EN1 is distributed to the D-type flip-flops equipped with enable functions in place of a plurality of clocks.

The characteristic feature of this system resides in that an operation equivalent to that by use of a plurality of clocks can be realized by the single single-phase clock. This system is frequently used because of the ease of timing verification and design.

Figure 6:
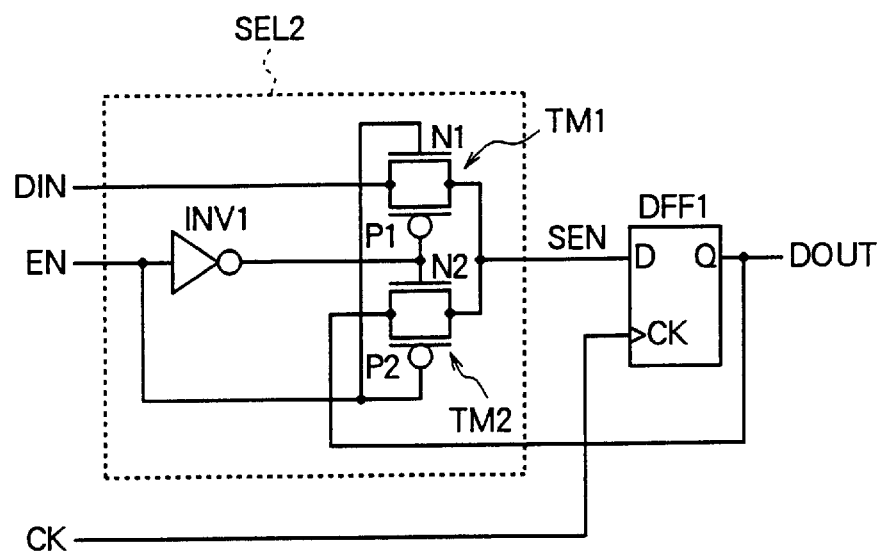
FIG. 6 is a circuit diagram of another example of the configuration of a synchronous D-type flip-flop equipped with an enable function according to the related art.
Figure 7:
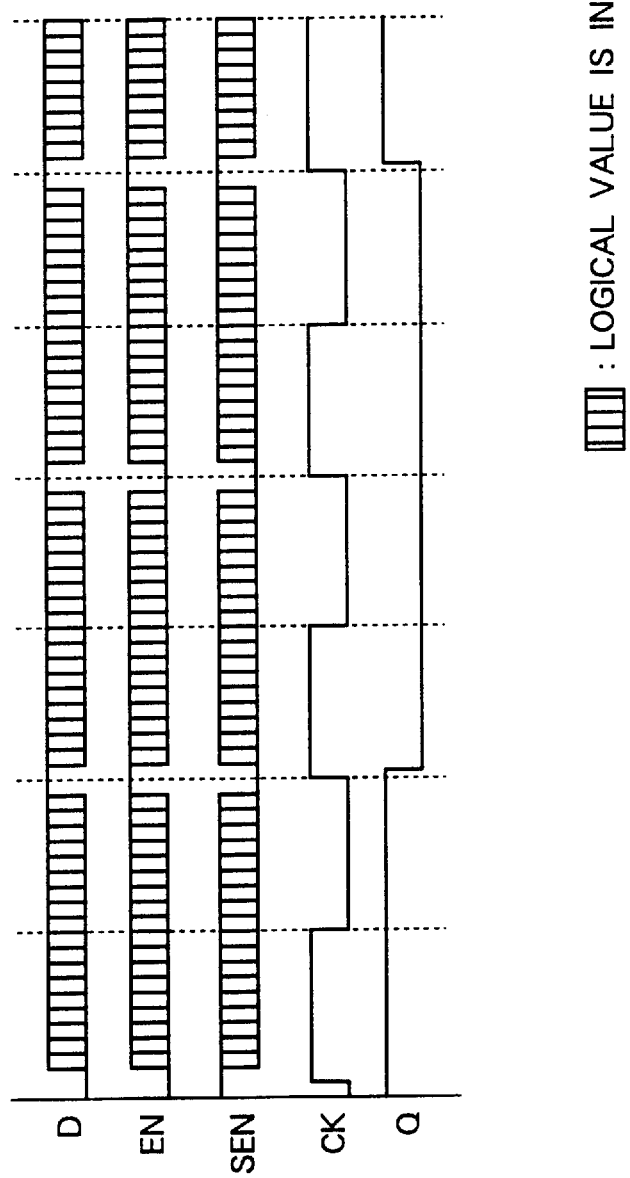
FIG. 7 is a timing chart of the circuit of FIG. 6.

FIG. 6 is a circuit diagram of another example of a configuration of a conventional synchronous D-type flip-flop equipped with an enable function; and FIG. 7 is a timing chart thereof.

This D-type flip-flop equipped with an enable function has a different configuration of the selector SEL2 from that of FIG. 3. The rest of the configuration and operation are not substantially changed.

Namely, the selector SEL2 is constituted by an inverter INV1 for inverting the enable signal EN, a transfer gate TM1 comprising a p-channel MOS (PMOS) transistor P1 and an n-channel MOS (NMOS) transistor N1 which selects one of the data input signal DIN and output signal DOUT and transfers the same to a node SEN, and a transfer gate TM2 comprising a PMOS transistor P2 and an NMOS transistor N2.

The selector SEL2 is arranged in the front of the input terminal D of the usual D-type flip-flop DFF1. The selection of the data input signal DIN from the outside and the output signal DOUT of the D-type flip-flop DFF1 by the enable signal EN is realized by using this.

Figure 8:
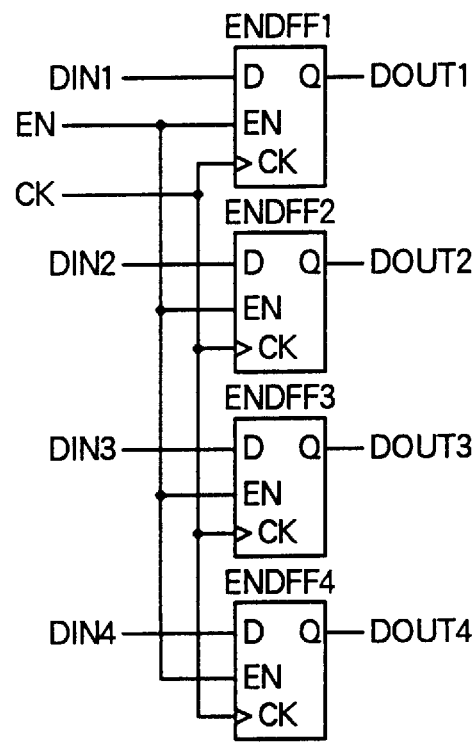
FIG. 8 is a circuit diagram of an example of a configuration where a synchronous D-type flip-flop equipped with an enable function is used within a large scale LSI chip according to the related art.

More specifically, as shown in FIG. 7, the data input signal DIN is fetched into the D-type flip-flop DFF1 only when the enable signal EN is at the high level at the rising edge of the clock signal CK and the output signal DOUT changes. When the enable signal EN is at the low level at the rising edge of the clock signal CK, the output signal DOUT does not change. In the internal portion, however, the clock signal CK is supplied to the D-type flip-flop DFF1 also at this time and operation is carried out to fetch the output signal DOUT again through the selector SEL2.

Where such a synchronous D-type flip-flop equipped with an enable function is used in an actual large scale LSI chip, as shown in FIG. 8, the same enable signal EN is supplied to a plurality of synchronous D-type flip-flops DFF11 to DFF14 equipped with enable functions.

Finally, an explanation will be made of the system for generation of a function clock by a D-type flip-flop by referring to FIG. 9 and FIG. 10.

Figure 9:
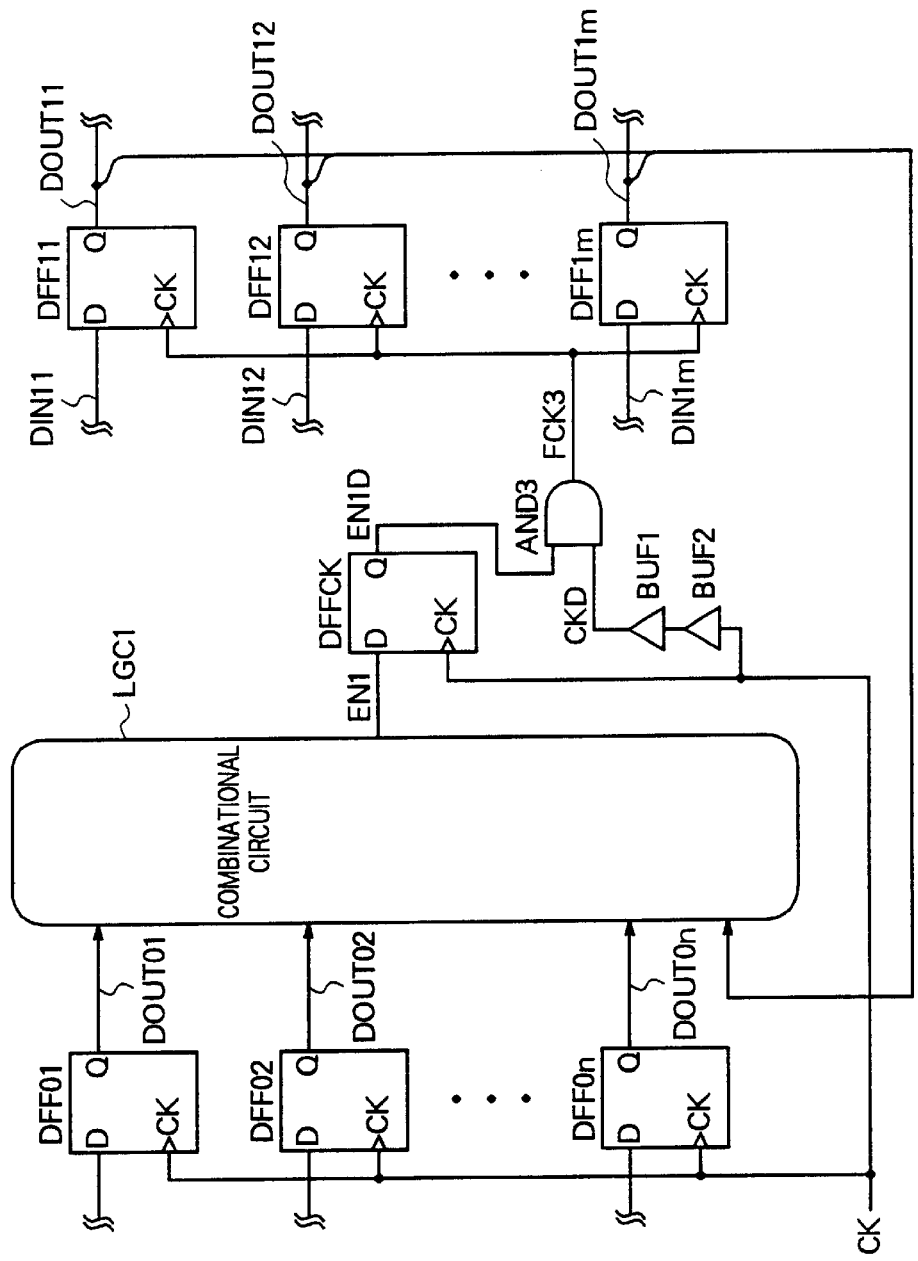
FIG. 9 is a circuit diagram of an example of the configuration of a function clock generation circuit adopting a system of generation of a function clock using a D-type flip-flop according to the related art.
Figure 10:
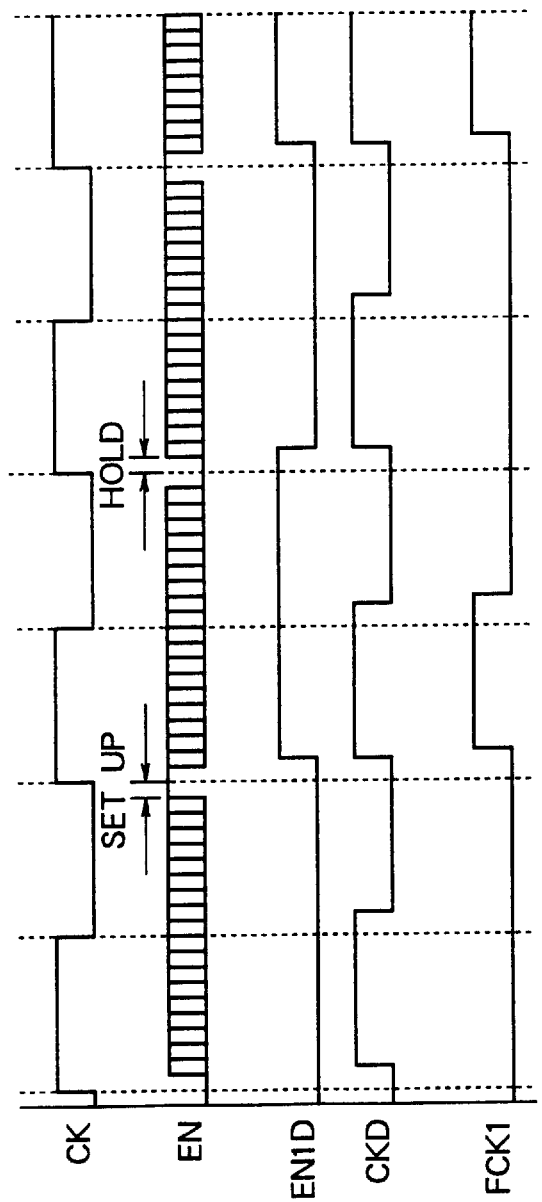
FIG. 10 is a timing chart of the circuit of FIG. 9.

FIG. 9 is a circuit diagram of an example of the configuration of a function clock generation circuit adopting this system; and FIG. 10 is a timing chart thereof.

In the circuit of FIG. 9, the enable signal ENI generated by the combinational circuit LGC1 is sampled by the D-type flip-flop DFFCK at the rising edge of the clock signal CK. The output signal ENLD as a result of this and a signal CKD obtained by delaying the clock signal CK at delay use buffers BUF1 and BUF2 are input to the 2-input AND gate AND3, whereby the function clock FCK3 is generated.

The function clock FCK3 generated in this way is used as the clock of the D-type flip-flops DFF11, DFF12 to DFF1m, etc. of the later stage.

Note that, the buffers BUF1 and BUF2 are for compensating for the delay time of the D-type flip-flop DFFCK and for preventing an occurrence of fluttering of the function clock FCK3 which becomes a cause of erroneous operation at the AND gate AND3.

In this system, the enable signal is sampled at the rising edge of the clock, so the design for the generation of the enable signal is easy.

In the system of generation of a function clock by a gate, while the circuit for the generation of the function clock and the delay time thereof are small, in contrast, during the low level period of the signal value of the clock signal CK, in order to prevent erroneous operation due to the generation of a pulse at an unnecessary location as a function clock FCK1, it is necessary to stabilize the system so that the negative logic enable signal XEN1 of the signal does not change.

Further, in both of the system of generation of a function clock by a gate and the system of generation of a function clock by a D-type flip-flop, the verification of the timing of the OR gate and AND gate for generation of the function clock was troublesome.

As mentioned before, in the system for generation of a function clock by a gate as shown in FIG. 1, sufficient care must be paid to the timing of the enable signal and clock pulse at the generation of the function clock and it is necessary to pay close attention to the generation of all function clocks so as not to cause unnecessary fluttering of signals in the function clock which becomes a cause of erroneous operation.

As shown in FIG. 2, the enable signal XEN1 must be stable during the period where the negative pulse of the clock signal CK is issued. Accordingly, it is necessary to generate the enable signal for a time of about a half of a clock cycle or less. The maximum delay of the generation of the enable signal must be controlled to about a half of that of the case where the D-type flip-flop equipped with an enable function is used.

Where detailed timing verification is carried out, when viewing for example the OR gate ORI of FIG. 1, that is, the generation of the function clock FCK1, the delay value is calculated for all signal propagation routes reaching the OR gate OR1 through the D-type flip-flops DFF01 to DFF0n and the combinational circuit LGC1 when defining the clock signal CK as the start point, the maximum value and the minimum value in this are found, and further similarly the signal propagation delay to the OR gate OR1 from the clock signal CK is found.

It must be verified from these delay values that the negative logic enable signal XEN1 is stable in the negative pulse section of the clock signal CK shown in FIG. 2.

When this is verified by logical simulation, it is difficult to prepare a test pattern input for viewing the minimum delay and maximum delay by a large number of existing signal propagation routes.

When static timing verification software is used, the test pattern input becomes unnecessary, but there is no mechanism for automatically checking the relationship of timing among input signals of the gate of the OR gate OR1 of FIG. 1, so it is necessary to find the delay by designating the delay measurement section and calculating the difference thereof later. This is very troublesome where a large number of function clocks are used.

For such a reason, irrespective of the fact that the conventional system of generation of a function clock by a gate is more advantageous than the conventional system using a D-type flip-flop equipped with an enable function in view of the chip area and power consumption, many digital circuit designers tend to avoid using this system.

Further, in the system of generation of a function clock using a D-type flip-flop, the circuit is large and further there is a large increase in delay when generating a clock reproduction signal from the original clock signal, so the timing design in the overall circuit using this becomes difficult.

Further, in the case of a system using a D-type flip-flop equipped with an enable function, as shown in FIG. 3 and FIG. 6, the number of transistors is larger in comparison with the usual D-type flip-flop, therefore it is necessary to form the interconnections so that the enable signal is also supplied to the individual D-type flip-flops equipped with enable functions in addition to the clock.

In FIG. 8 explained before, an example was shown where the enable signal was interconnected to four locations, but there are also cases where it is interconnected to tens or hundreds of locations. Even in such cases, in a conventional synchronous D-type flip-flop equipped with an enable function, individual internal selectors become necessary, so the circuit scale is enlarged. Further, as shown in FIG. 7, irrespective of the enable signal EN, the D-type flip-flop is always driven by the clock signal CK, therefore the power consumption is large.

As described above, in the system for generation of a function clock by a gate, the timing verification for preventing erroneous operation was troublesome. Further, in a system using a D-type flip-flop equipped with an enable function, it was necessary to distribute the enable signal to the individual D-type flip-flops equipped with enable functions separately from the clock signal. Even in a case where the enable signal rarely becomes the high level, the D-type flip-flop operates for every clock, therefore there was the problem of an increase of the interconnection and cell area and the power consumption.

Further, in the system of generation of a function clock using a D-type flip-flop, the circuit for the generation of the function clock was large and the efficiency was poor when a large number of function clocks were generated. In addition, the individual function clocks were used in only a small number of D-type flip-flops.

Further, there were the drawbacks that there was a large increase in the delay caused by the generation of the function clock and the timing design in the entire chip using this became difficult.

The present invention will now be explained in detail with reference to preferred embodiments.

First Embodiment

Figure 11:
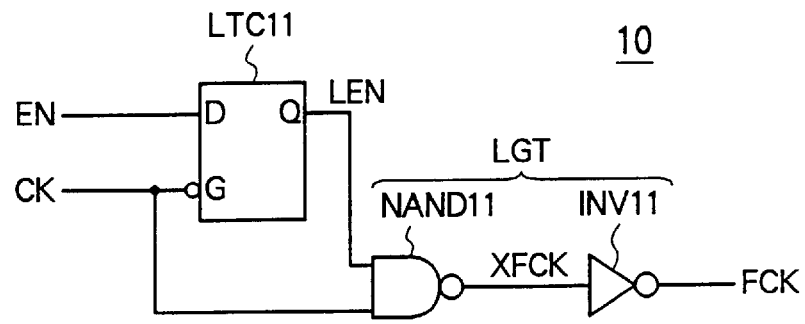
FIG. 11 is a circuit diagram of a first embodiment of a function clock generation circuit according to the present invention.

FIG. 11 is a circuit diagram of a first embodiment of a function clock generation circuit according to the present invention.

This function clock generation circuit 10 is constituted by, as shown in FIG. 11, a through latch circuit LTC11, a 2-input NAND gate NAND11, and an inverter INV11.

The input terminal D of the through latch circuit LTC11 is connected to the input line of the enable signal EN, and an inverted clock input terminal G is connected to the input line of the clock signal. One input terminal of the NAND gate NAND11 is connected to the output terminal Q of the through latch circuit LTC11, the other input terminal is connected to the input terminal of the clock signal CK, and the output terminal is connected to the input terminal of the inverter INV11.

In this function clock generation circuit 10, the enable signal EN is sampled at the rising edge of the clock signal CK at the through latch circuit LTC11. The clock pulse immediately after the sampling is passed or blocked by the logical gate LGT comprising the NAND gate NAND11 and inverter INV11 by that value.

Specifically, the through latch circuit LTC outputs the enable signal EN as it is when the clock signal CK is at the low level and outputs the enable signal value at the point of time immediately before the clock signal CK changes from the low level to the high level when the clock signal CK is at the high level.

Further, the logical gate LGT comprising the NAND gate NAND11 and the inverter INV11 outputs a function clock FCK of the high level only when the output signal of the through latch circuit LTC11 is at the high level and the clock signal CK is at the high level and outputs a function clock FCK of a low level at times other than this, that is, when the output signal of the through latch circuit LTC11 is at the high level and the clock signal CK is at the low level or when the output signal of the through latch circuit LTC11 is at the low level and also the clock signal CK is at the low level.

Figure 12:
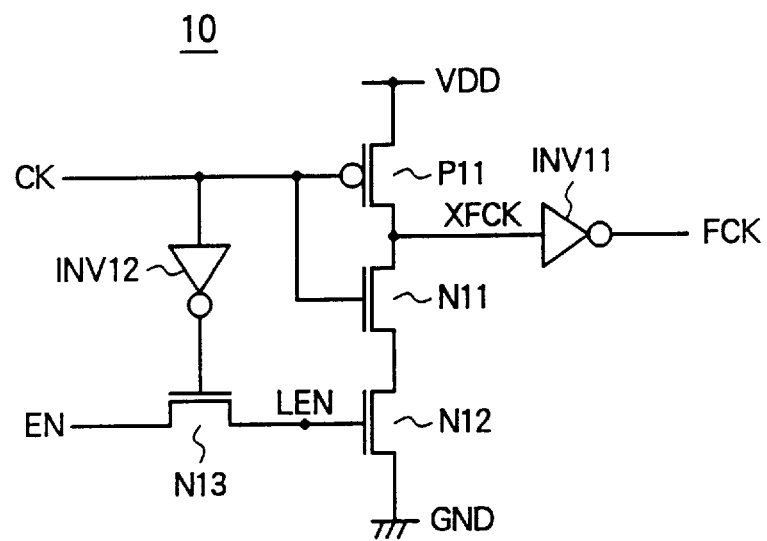
FIG. 12 is a circuit diagram of a concrete example of the configuration of the circuit of FIG. 11.

FIG. 12 is a circuit diagram of a concrete example of the configuration of the function clock generation circuit 10 of FIG. 11.

The circuit of FIG. 12 is constituted by the PMOS transistor P11, NMOS transistors N11 to N13, and inverters INV11 and INV12.

The PMOS transistor 11 and NMOS transistors N11 and N12 are connected in series between a power source voltage $V_{DD}$ supply line and a ground line GND. Gate electrodes of the PMOS transistor P11 and the NMOS transistor N11 and the input terminal of the inverter INV12 are connected to the input terminal of the clock signal CK. The gate of the NMOS transistor N11 is connected to the input line of the enable signal EN via the NMOS transistor N13. The gate electrode of the NMOS transistor NT13 is connected to the output terminal of the inverter INV12, and the connection point of drain electrodes of the PMOS transistor P11 and the NMOS transistor N11 is connected to the input terminal of the inverter INV11.

In the present circuit, a dynamic type through latch circuit is constituted by the inverter INV12 and the NMOS transistor N13, and the NAND gate is constituted by the PMOS transistor P11 and the NMOS transistors N11 and N12.

More concretely, a circuit is constituted which precharges the node XFCK for a period where the clock signal CK is at the low level and operates as a NAND for a period where the clock signal CK is at the high level.

Next, the operation by the above configuration will be explained by referring to the timing chart of FIG. 13.

First, when the clock signal CK is at the low level, in the dynamic type through latch circuit comprising the inverter INV12 and NMOS transistor N13, the NMOS transistor N13 is held in the conductive state and the value of the enable signal EN is propagated to the node LEN.

When the clock signal CK becomes the high level, the NMOS transistor N13 becomes the nonconductive state, and the value of the enable signal EN immediately before the clock signal CK becomes the high level is held at the node LEN for a term where the clock signal CK is at the high level.

On the other hand, in the term where the clock signal CK is at the low level, the PMOS transistor P11 is held in the conductive state, so the connection point XFCK of drain electrodes of the PMOS transistor P11 and the NMOS transistor N11 is held at the high level. Then, when the clock signal CK becomes the high level, the PMOS transistor P11 becomes the nonconductive state, and the NMOS transistor N11 becomes the conductive state.

Here, if the level of the node LEN is the high level when the clock signal CK is at the high level, the NMOS transistor N12 becomes the conductive state. As a result, the node XFCK is discharged and becomes the low level. Accordingly, the function clock FCK output from the inverter INV11 becomes the high level. Namely, the positive pulse of the clock signal CK is propagated to the output node of the circuit and output as the function clock FCK.

If the level of the node LEN is at the low level when the clock signal CK is at the high level, the NMOS transistor N12 is held in the nonconductive state. As a result, the node XFCK is not discharged but is held at the high level as it is. Accordingly, the function clock FCK output from the inverter INV11 is held at the low level as it is. Namely, the propagation of the positive pulse of the clock signal CK to the output node is blocked.

When viewing this as a whole circuit, the enable signal EN is sampled at the rising edge of the clock signal CK, and the positive pulse immediately after the rising of the clock signal CK is propagated to the output node or blocked according to the result thereof.

According to the first embodiment explained above, a function clock having a high precision can be generated without performing troublesome control and a low power consumption and reduction of surface area can be achieved.

Second Embodiment

Figure 14:
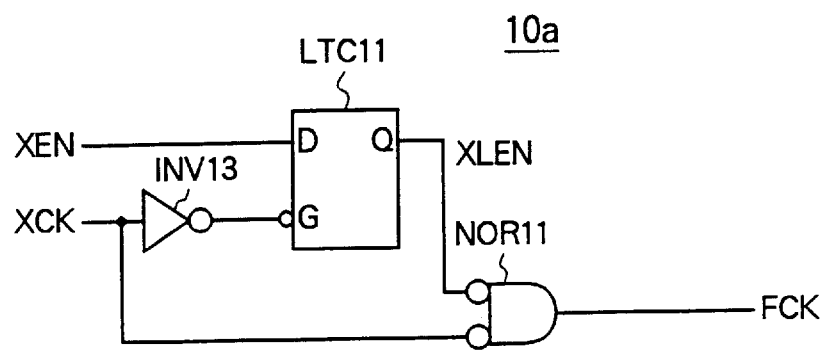
FIG. 14 is a circuit diagram of a second embodiment of the function clock generation circuit according to the present invention.

FIG. 14 is a circuit diagram of a second embodiment of the function clock generation circuit according to the present invention.

The point of difference of the present circuit from the circuit of FIG. 11 of the first embodiment resides in that the enable signal and the clock signal are set as inverted signals to those of the case of FIG. 11, an inverter INV13 is provided on the input side of the inversion input terminal G of the through latch circuit LTC11, and the 2-input NOR gate NOR11 is provided in place of the NAND gate NAND 11 and the inverter INV11.

According to the second embodiment, a similar effect to the effect by the above first embodiment can be obtained.

Third Embodiment

Figure 15:
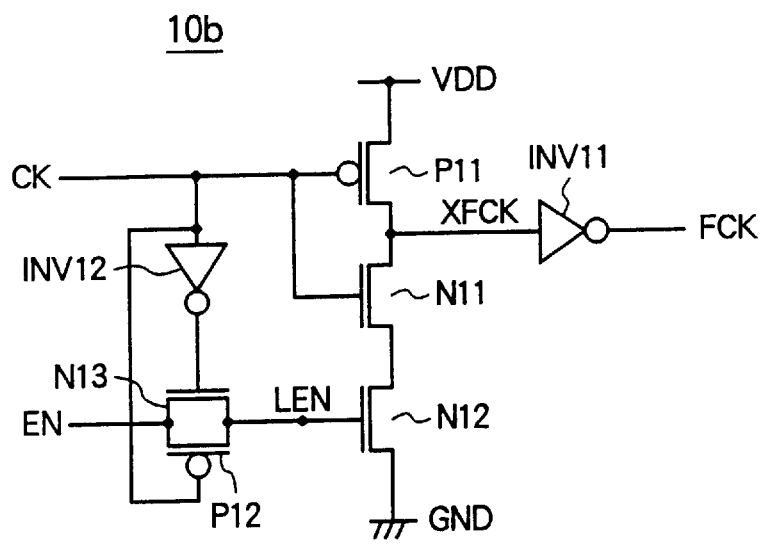
FIG. 15 is a circuit diagram of a third embodiment of the function clock generation circuit according to the present invention.

FIG. 15 is a circuit diagram of a third embodiment of the function clock generation circuit according to the present invention.

The point of difference of the present circuit from the circuit of FIG. 12 of the first embodiment mentioned above resides in the provision of a PMOS transistor P12 with source and drain electrodes connected to the source and drain electrodes of the NMOS transistor N13 of the dynamic type through latch circuit and with a gate electrode connected to the input line of the clock signal CK.

The rest of the configuration and operation are similar to those of the circuit of FIG. 12.

According to the third embodiment, in addition to the effect by the above first embodiment, there is an advantage that this circuit operates even with a low power source voltage.

Fourth Embodiment

Figure 16:
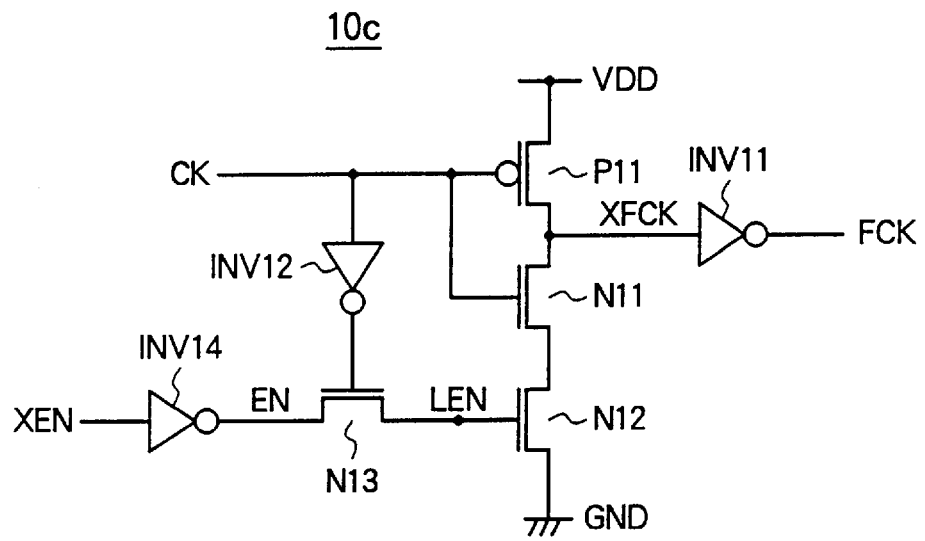
FIG. 16 is a circuit diagram of a fourth embodiment of the function clock generation circuit according to the present invention.

FIG. 16 is a circuit diagram of a fourth embodiment of the function clock generation circuit according to the present invention.

The point of difference of the present fourth embodiment from the circuit of FIG. 12 of the first embodiment resides in that an inverter INV14 is provided on the input side of the enable signal EN of the NMOS transistor N13 of the dynamic type through latch circuit, and the enable signal input is inverted.

The rest of the configuration and operation are similar to those of the circuit of FIG. 12.

According to the fourth embodiment, an effect similar to the effect by the above first embodiment can be obtained.

Note that, similarly, it is also possible to easily delete the inverter INV11 on the output side of FIG. 12 and further add the inverter and invert the FCK. The same is true also for the clock input.

Fifth Embodiment

Figure 17:
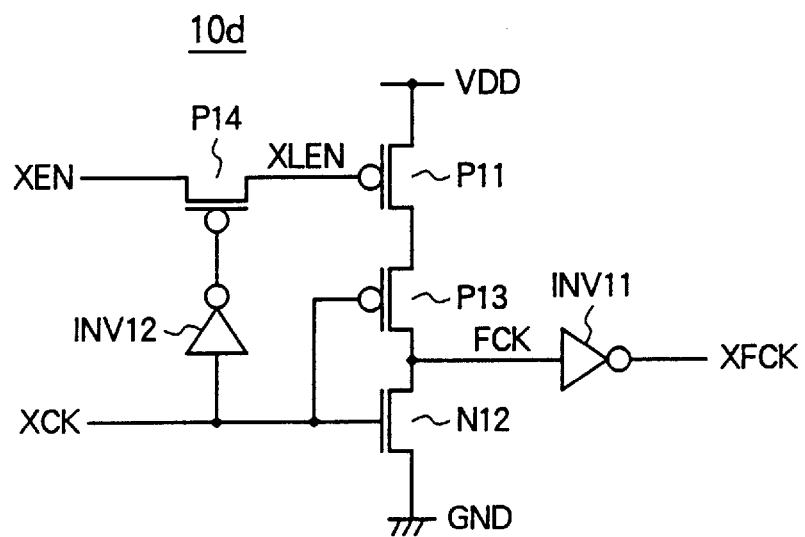
FIG. 17 is a circuit diagram of a fifth embodiment of the function clock generation circuit according to the present invention.

FIG. 17 is a circuit diagram of a fifth embodiment of the function clock generation circuit according to the present invention.

The point of difference of the present fifth embodiment from the circuit of FIG. 12 of the first embodiment resides in that the whole logic of the circuit of FIG. 12 is inverted.

Specifically, the PMOS transistor P13 is connected in place of the NMOS transistor N11 of FIG. 12, the gate of the PMOS transistor P11 is connected to the input line of the inversion enable signal XEN via the PMOS transistor P14, the gate of the PMOS transistor P14 is connected to the input line of the inverted clock signal XCK via the inverter INV12, and further the gates of the PMOS transistor P13 and the NMOS transistor N14 are connected to the input line of the inverted clock signal XCK, and the connection point of drains of the PMOS transistor P13 and NMOS transistor N12 is connected to the input terminal of the inverter INV11.

According to the fifth embodiment, a similar effect to the effect by the above first embodiment can be obtained.

Sixth Embodiment

Figure 18:
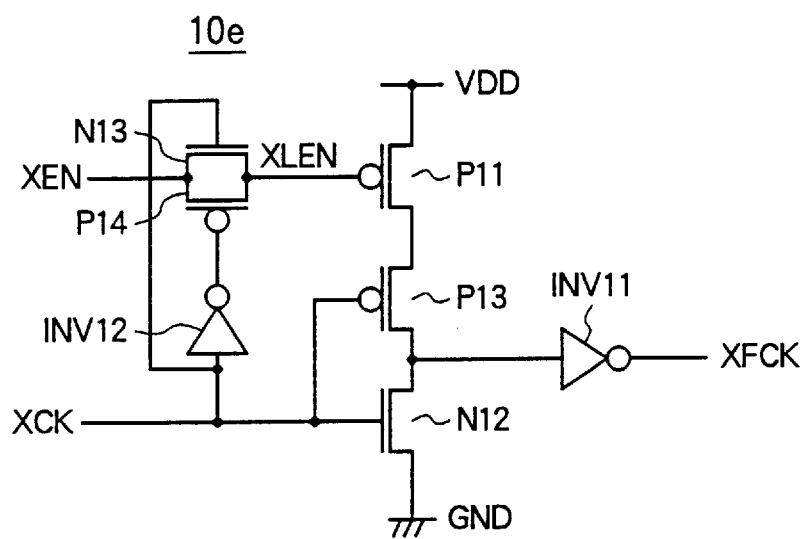
FIG. 18 is a circuit diagram of a sixth embodiment of the function clock generation circuit according to the present invention.

FIG. 18 is a circuit diagram of a sixth embodiment of the function clock generation circuit according to the present invention.

The point of difference of the sixth embodiment from the fifth embodiment resides in the provision of an NMOS transistor N13 with source and drain electrodes connected to the source and drain electrodes of the PMOS transistor P14 of the dynamic type through latch circuit of FIG. 17 and gate electrode connected to the input line of the inverted clock signal XCK.

The rest of the configuration and operation are similar to those of the circuit of FIG. 17.

According to the sixth embodiment, in addition to the effect of the above fifth embodiment, there is an advantage that the circuit operates even with a low power source voltage.

Seventh Embodiment

Figure 19:
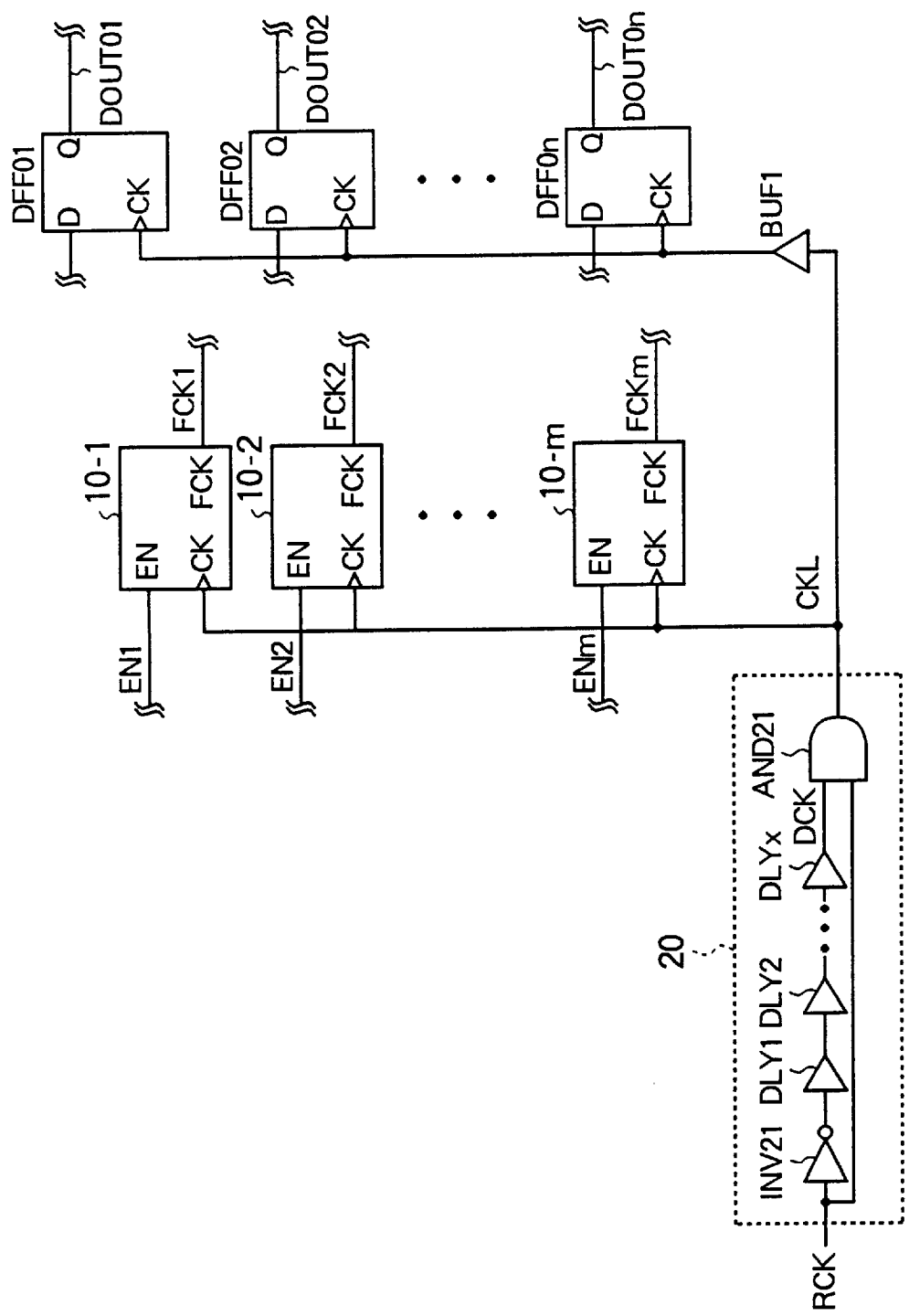
FIG. 19 is a circuit diagram of a seventh embodiment of the function clock generation circuit according to the present invention.

FIG. 19 is a circuit diagram of a seventh embodiment of the function clock generation circuit according to the present invention.

The seventh embodiment shows an example in which a clock pulse width limiting circuit 20 for limiting the pulse width of the clock signal CK supplied to the function clock generation circuit 10 is provided.

Further, FIG. 19 shows as an example a case where clock signals CKL with limited pulse widths are supplied in parallel to m number of function clock generation circuits 10-1 to 10-m and n number of D-type flip-flops DFF01 to DFF0n.

The clock pulse width limiting circuit 20 is constituted by an inverter INV21, x number of delay elements DLY1 to DLYx connected in series, and a 2-input AND gate AND21.

The input terminal of the inverter INV21 is connected to the input line of a route clock signal RCK, the output terminal is connected to the input terminal of a delay element DLY1, one input terminal of the AND gate AND21 is connected to the output terminal of a delay element DLYx, and the other input terminal is connected to the input line of the route clock signal RCK. The output terminal of the AND gate AND21 is connected to the function clock generation circuits 10-1 to 10-m and the clock input terminals of the D-type flip-flops DFF01 to DFF0n.

Figure 20:
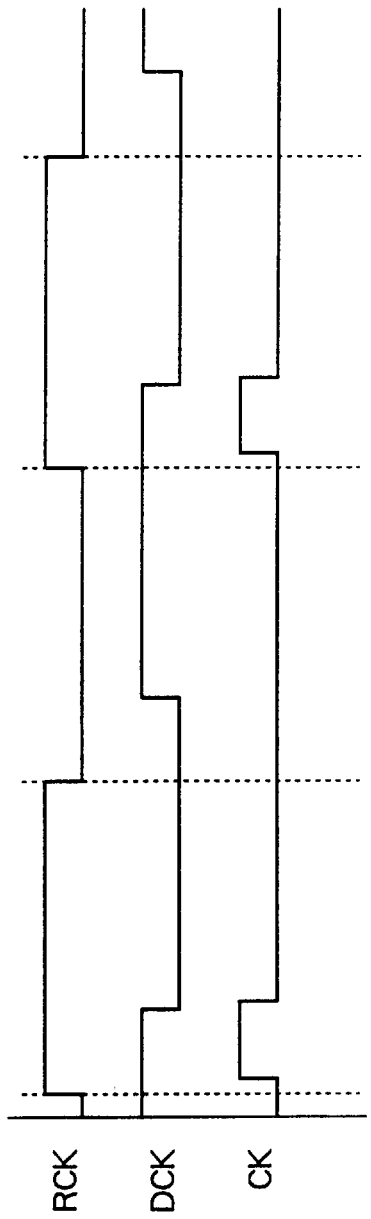
FIG. 20 is a timing chart of the operation of a clock pulse width limiting circuit of FIG. 19.

FIG. 20 is a timing chart of the operation of the clock pulse width limiting circuit 20 of FIG. 19.

According to the present circuit 20, the route clock signal RCK passes through the inverter INV21 and the delay elements DLY1, DLY2, . . . , DLYx where it is subjected to inversion and delay to generate the signal DCK, which is input to the AND gate AND21.

The logical AND between the signal DCK and the route clock signal RCK is taken at the AND gate AND21 and the clock signal CKL is generated.

Namely, immediately after the rising of the route clock signal RCK, the clock signal CKL having a pulse width determined by the delay time of the inverter INV21 and delay elements DLY1, DLY2, . . . , DLYx is generated.

The clock signal CKL limited in pulse width in this way is supplied to the function clock generation circuits 10-1 to 10-m.

In this case, since the clock pulse width is limited to less than a certain value, the maximum time for which the dynamic nodes in the function clock generation circuits 10-1 to 10-m, that is, the nodes corresponding to LEN and XFCK of FIG. 12, hold the value in the high impedance state is guaranteed, and, as a result, there is no worry of erroneous operation due to the leakage of electric charge.

Further, the clock signal CKL limited in its pulse width can be directly input to also the D-type flip-flop not requiring the function clock without passing through the function clock generation circuit. As shown in FIG. 19, it is also possible to directly supply this to the D-type flip-flops DFF01 to DFF0n.

According to the seventh embodiment, if a clock pulse width limiting circuit 20 for limiting the pulse width of the clock signal is placed at one portion at the base of a so-called clock tree, even in a circuit as in FIG. 19 using for example the circuit of FIG. 12 partially performing a dynamic operation, the restriction of the lowest operation frequency for the original clock, that is, in FIG. 19, the root clock signal RCK, is eliminated, the root clock signal RCK may be temporarily stopped, and the circuit of FIG. 19 can perform an equivalent operation to that of the static circuit.

Namely, in the present circuit, the maximum value of the period for which the signal value is dynamically held in the dynamic type small function clock generation circuits 10-1 to 10-m is guaranteed by the clock pulse width limiting circuit 20 and a pseudo static operation is performed, therefore there is an advantage that low power consumption and a reduction of the area can be realized by making the function equivalent to that of a conventional synchronous D-type flip-flop equipped with an enable function.

Eighth Embodiment

Figure 21:
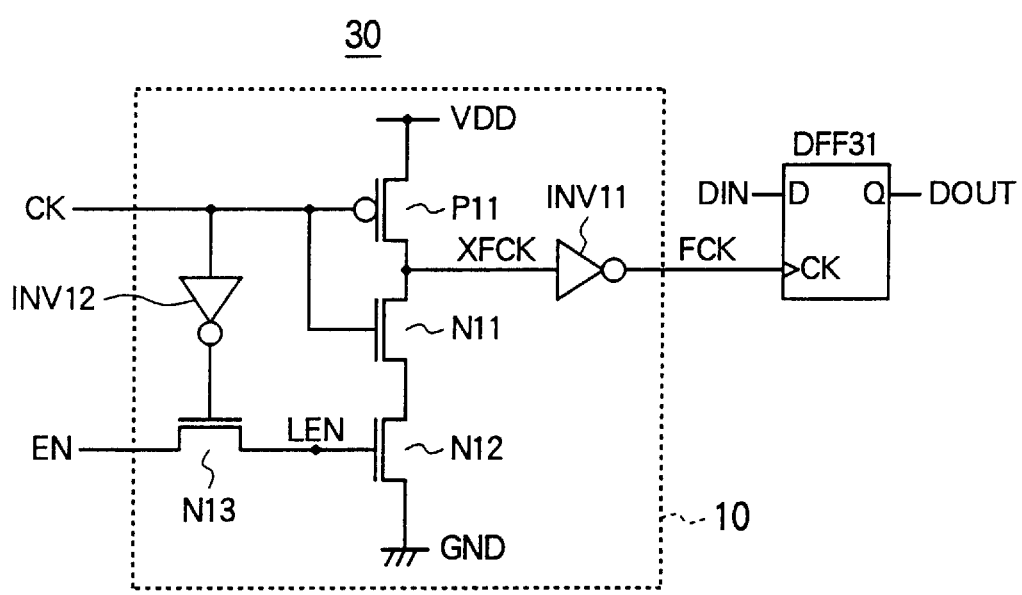
FIG. 21 is a view of an eighth embodiment, that is, a circuit diagram of a D-type flip-flop equipped with an enable function adopting a function clock generation circuit according to the present invention.

FIG. 21 is a circuit diagram of an eighth embodiment, that is, a circuit diagram of a D-type flip-flop equipped with an enable function adopting the function clock generation circuit according to the present invention.

In the eighth embodiment, a D-type flip-flop 30 equipped with an enable function is constituted by connecting the output terminal of the inverter INV11 which is the output terminal of the function clock generation circuit 10 shown in FIG. 12 to the clock input terminal of the D-type flip-flop DFF31.

Figure 22:
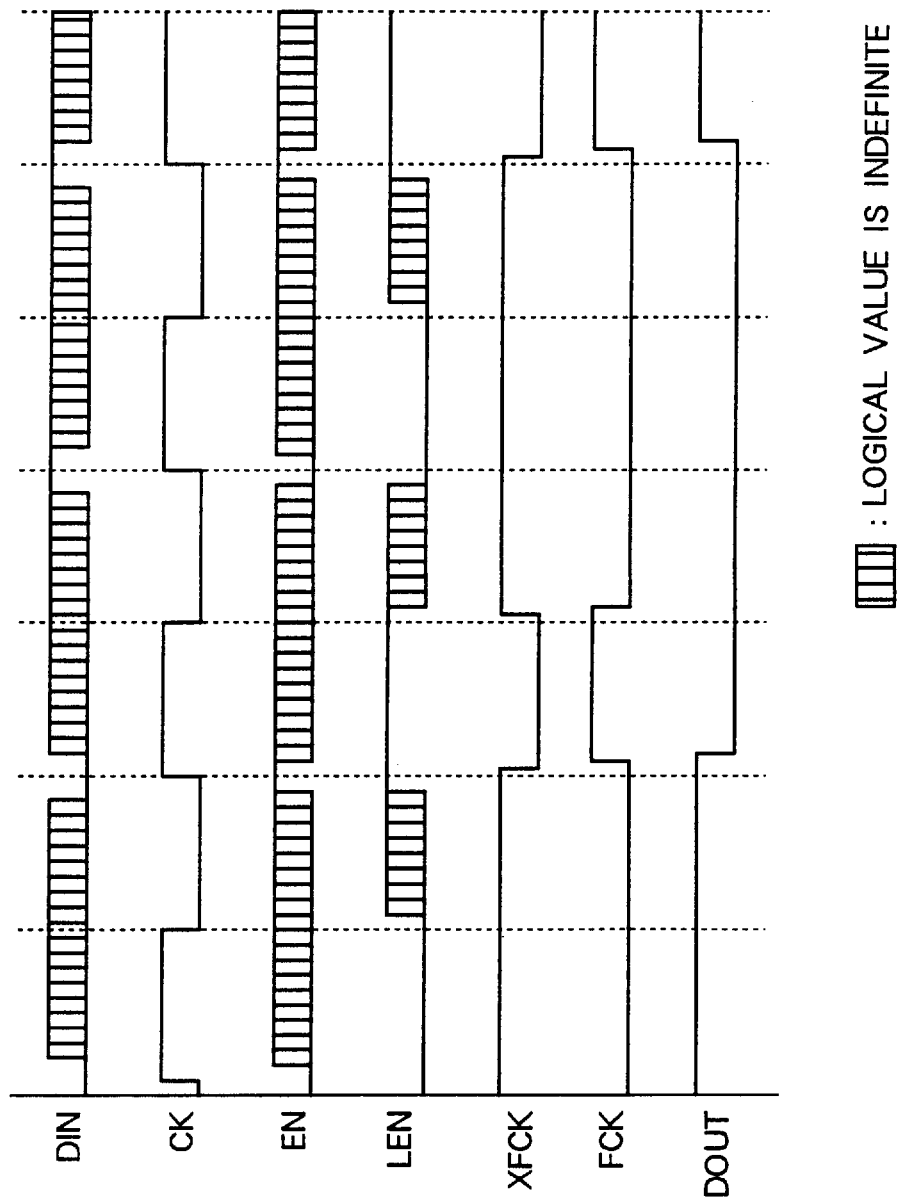
FIG. 22 is a timing chart of the operation of the circuit of FIG. 21.

FIG. 22 shows a timing chart of the operation of the circuit of FIG. 21.

In this circuit 30, the enable signal EN is input to the NMOS transistor N13. In the section in which the clock signal CK is at the low level, the NMOS transistor N13 becomes the conductive state and is propagated to the node LEN on the output side of the NMOS transistor N13 as it is.

In the section in which the clock signal CK is at the high level, the NMOS transistor N13 becomes the nonconductive state. The value of the enable signal EN immediately before the clock signal CK becomes the high level is held by the charge stored in the gate capacitance etc. of the NMOS transistor N12 on the node LEN.

The signal of the node LEN is input to the NAND gate NAND11, constituted by three MOS transistors P11, N11, and N12, together with the clock signal CK, whereby the function clock XFCK is generated. Then, this signal XFCK is inverted at the inverter INV11 and supplied to the clock input of the D-type flip-flop DFF31 as the function clock FCK.

The DIN signal at the rising edge of the function clock FCK is fetched into the D-type flip-flop DFF31 and output from the output terminal Q.

Figure 23:
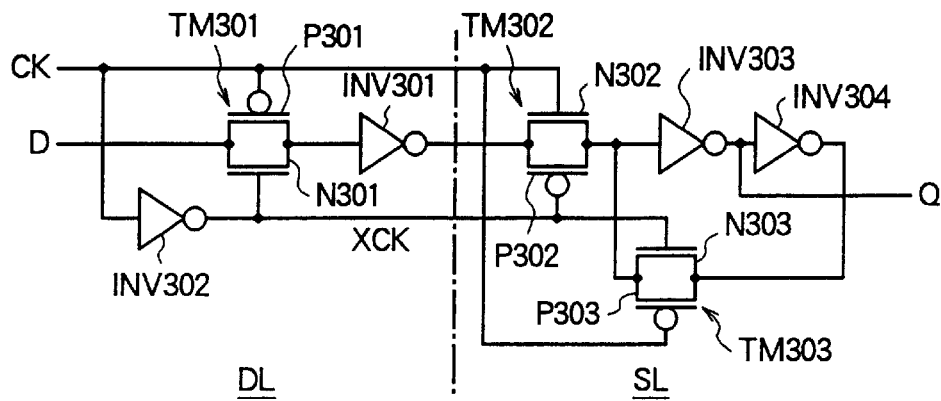
FIG. 23 is a circuit diagram of an example of the configuration of a D-type flip-flop in which the front latch between two front and rear static latches constituting a usual static D-type flip-flop is constituted as a dynamic latch.

Note that, the D-type flip-flop can be constituted as shown in for example FIG. 23.

Namely, FIG. 23 shows an example of a circuit of the D-type flip-flop in which the front latch between two front and rear static latches constituting the usual static D-type flip-flop is set as the dynamic latch.

Specifically, the front dynamic latch DL is constituted by a transfer gate TM301 constituted by connecting the sources and drains of a PMOS transistor P301 and an NMOS transistor N301 and inverters INV301 and INV302, while the rear static latch SL is constituted by a transfer gate TM302 constituted by connecting the sources and drains of a PMOS transistor P302 and an NMOS transistor N302, a transfer gate TM303 constituted by connecting the sources and drains of a PMOS transistor P303 and an NMOS transistor N302, and inverters INV303 and inverters INV303 and INV304.

The concrete connections of the elements are as follows.

The gate of the PMOS transistor P301 of the transfer gate TM301, the gate of the NMOS transistor N302 of the transfer gate TM302, and the gate of the PMOS transistor P303 of the transfer gate TM303 are connected to the clock input terminal CK. The gate of the NMOS transistor N301 of the transfer gate TM301, the gate of the PMOS transistor P302 of the transfer gate TM302, and the gate of the NMOS transistor N303 of the transfer gate TM303 are connected to the output terminal of the inverter INV302, and the input terminal of the inverter INV302 is connected to the clock input terminal.

One input/output terminal of the transfer gate TM301 is connected to the data input terminal D, while the other input/output terminal is connected to the input terminal of the inverter INV301. The output terminal of the inverter INV301 is connected to one input/output terminal of the transfer gate TM302, the other input/output terminal of the transfer gate TM302 is connected to the input terminal of the inverter INV303, and the output terminal of the inverter INV303 is connected to the input terminal and output terminal Q of the inverter INV304. The output terminal of the inverter INV304 is connected to one input/output terminal of the transfer gate TM303, and the other output terminal of the transfer gate TM303 is connected to the input terminal of the inverter INV303.

In such a configuration, in the front dynamic latch DL, for example for the period for which the function clock FCK input to the terminal CK is at the low level, the transfer gate TM301 becomes the conductive state. By this, the input data input to the input terminal D passes through the transfer gate TM301 and is further subjected to the level inversion action at the inverter INV301 and propagated to the rear static latch SL.

For the period for which the function clock FCK is at the high level, the transfer gate TM301 becomes the nonconductive state, and the value of the input data immediately before the function clock FCK becomes the high level is dynamically held by the charge stored in the input capacitance of the inverter INV301.

In the rear static latch SL, for the period for which the function clock FCK is at the high level, the transfer gate TM302 becomes the conductive state, the transfer gate TM303 becomes the nonconductive state, and the output of the inverter INV301 of the front dynamic latch DL is propagated to the output terminal Q via the transfer gate TM302 and the inverter INV303.

Then, for the period for which the function clock FCK is at the low level, the transfer gate TM302 becomes the nonconductive state, the transfer gate TM303 becomes the conductive state, and the output value of the INV301 immediately before the function clock FCK becomes the high level is held static by a closed loop formed by the inverters INV303 and INV304 and the transfer gate TM303, and the held data is output from the output terminal Q.

Figure 24:
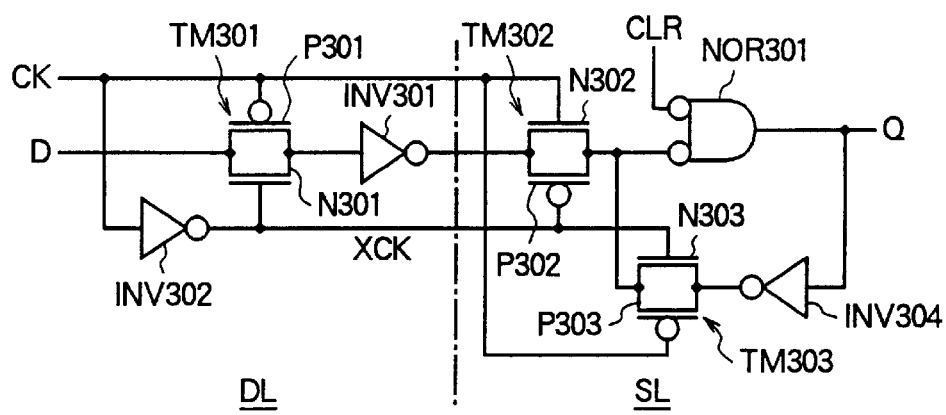
FIG. 24 is a circuit diagram of an example of a configuration in which a clear function is added to the circuit of FIG. 23.

FIG. 24 is a circuit diagram of the D-type flip-flop obtained by adding an asynchronous clear function to the circuit of FIG. 23.

The point of difference of the present circuit from the circuit of FIG. 23 resides in that a 2-input NOR gate NOR301 is provided in place of the inverter INV303 of the static latch SL.

Specifically, one input terminal of the 2-input NOR gate NOR301 is connected to the input/output terminal of the transfer gate TM302, the other input terminal is connected to the input terminal CLR of the clear signal, and the output terminal of the NOR gate NOR301 is connected to the input terminal and output terminal Q of the inverter INV304.

In this circuit, by inputting the clear signal of the high level to the clear terminal CLR, the output level from the output terminal Q can be set at the low level.

Figure 25:
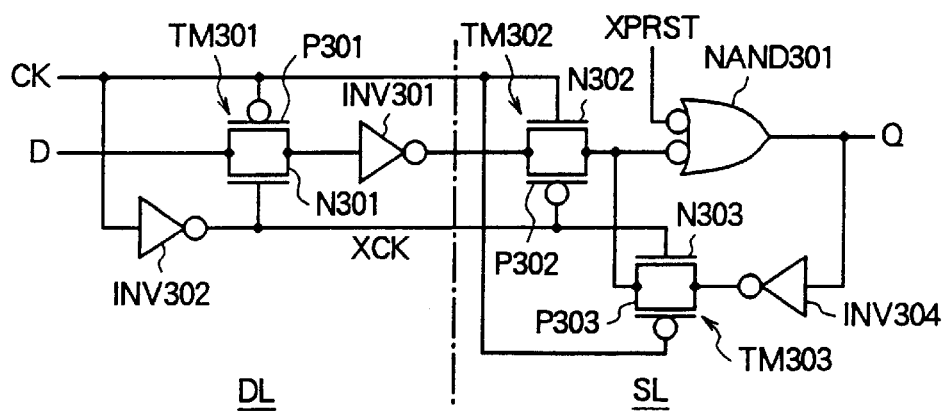
FIG. 25 is a circuit diagram of an example of a configuration in which a preset function is added to the circuit of FIG. 23.

Further, FIG. 25 is a circuit diagram of a D-type flip-flop obtained by adding an asynchronous preset function to the circuit of FIG. 23.

The point of difference of the present circuit from the circuit of FIG. 23 resides in that a 2-input NAND gate NAND301 is provided in place of the inverter INV303 of the static latch SL.

Specifically, one input terminal of the NAND gate NAND301 is connected to the input/output terminal of the transfer gate TM302, the other input terminal is connected to the input terminal XPRST of the preset signal, and the output terminal of the NAND gate NAND301 is connected to the input terminal and output terminal Q of the inverter INV304.

In this circuit, by inputting the preset signal of the low level to the preset terminal XPRST, the output level from the output terminal Q can be set at the high level.

As explained above, according to the eighth embodiment, by combining the D-type flip-flop DFF31 and the function clock generation circuit according to the present invention, an equivalent function to that by the D-type flip-flop equipped with the enable function operating by sampling the enable signal at the rising edge of the conventional clock can be realized.

In addition, since a circuit performing a dynamic operation for the period for which the clock is at the high level is adopted, the circuit scale and the power consumption can be reduced in comparison with the static circuit and the number of transistors and power consumption can be reduced in comparison with the conventional D-type flip-flop equipped with an enable function.

Ninth Embodiment

Figure 26:
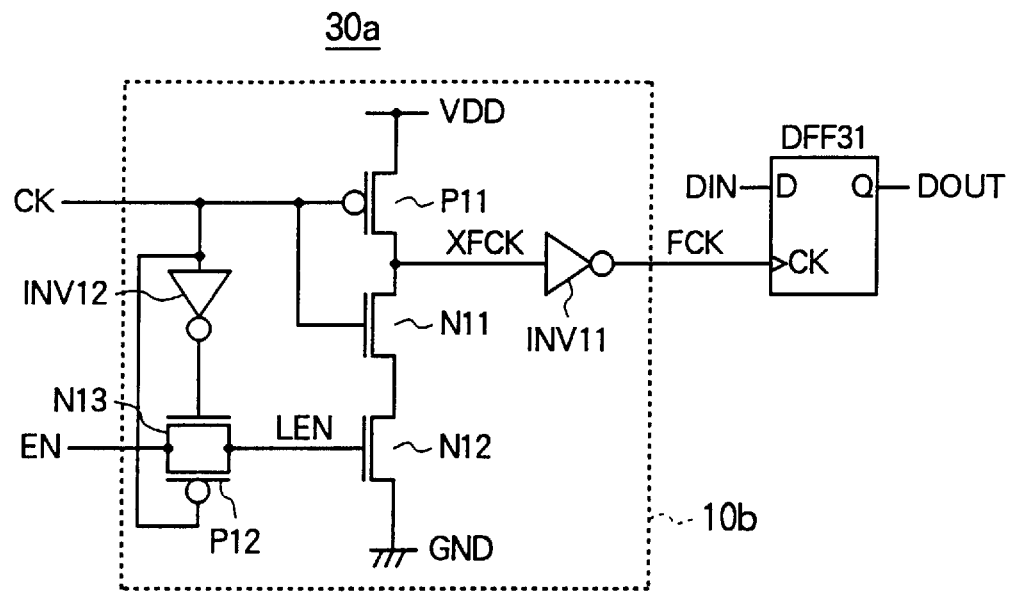
FIG. 26 is a circuit diagram of a ninth embodiment, that is, a circuit diagram of a D-type flip-flop equipped with an enable function adopting a function clock generation circuit according to the present invention.

FIG. 26 is a circuit diagram of a ninth embodiment, that is, a circuit diagram of another example of the D-type flip-flop equipped with an enable function adopting a function clock generation circuit according to the present invention.

In the ninth embodiment, a D-type flip-flop 30a equipped with an enable function is constituted by connecting the output terminal of the inverter INV11, that is, the output terminal of the function clock generation circuit 10b shown in FIG. 15, to the clock input terminal of the D-type flip-flop DFF31.

According to the ninth embodiment, an effect similar to the effect by the above eighth embodiment can be obtained.

10th Embodiment

Figure 27:
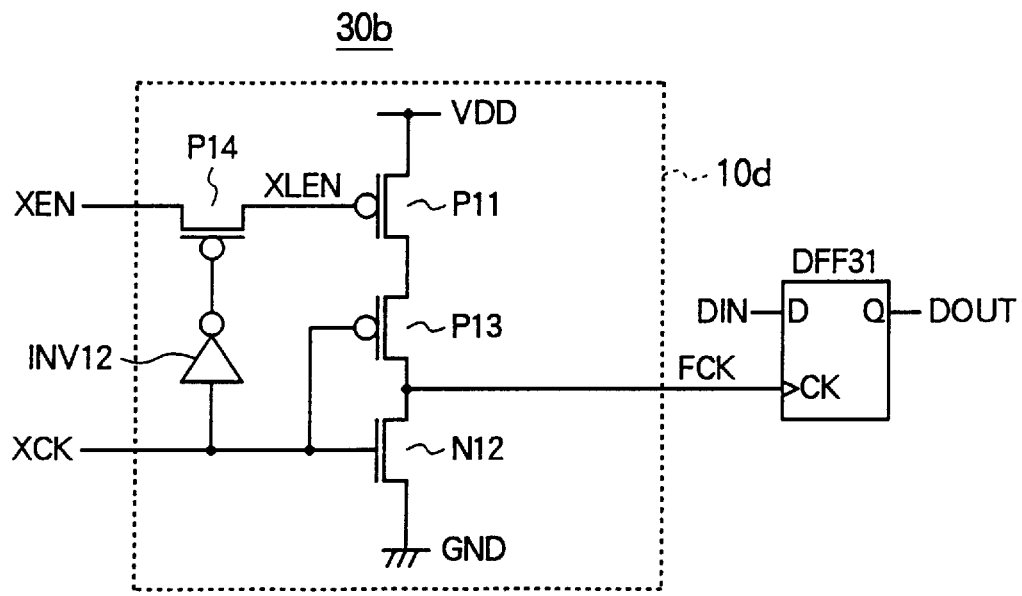
FIG. 27 is a circuit diagram of a 10th embodiment, that is, a circuit diagram of a D-type flip-flop equipped with an enable function adopting a function clock generation circuit according to the present invention.

FIG. 27 is a circuit diagram of a 10th embodiment, that is, a circuit diagram of another example of a D-type flip-flop equipped with an enable function adopting a function clock generation circuit according to the present invention.

In the 10th embodiment, a D-type flip-flop 30b equipped with an enable function is constituted by connecting the output terminal of the function clock generation circuit 10d obtained by deleting the inverter INV11 from the circuit of FIG. 17 (connection point of drains of the PMOS transistor P13 and the NMOS transistor N12) to the clock input terminal of the D-type flip-flop DFF31.

According to the 10th embodiment, an effect similar to the effect by the above eighth embodiment can be obtained.

11th Embodiment

Figure 28:
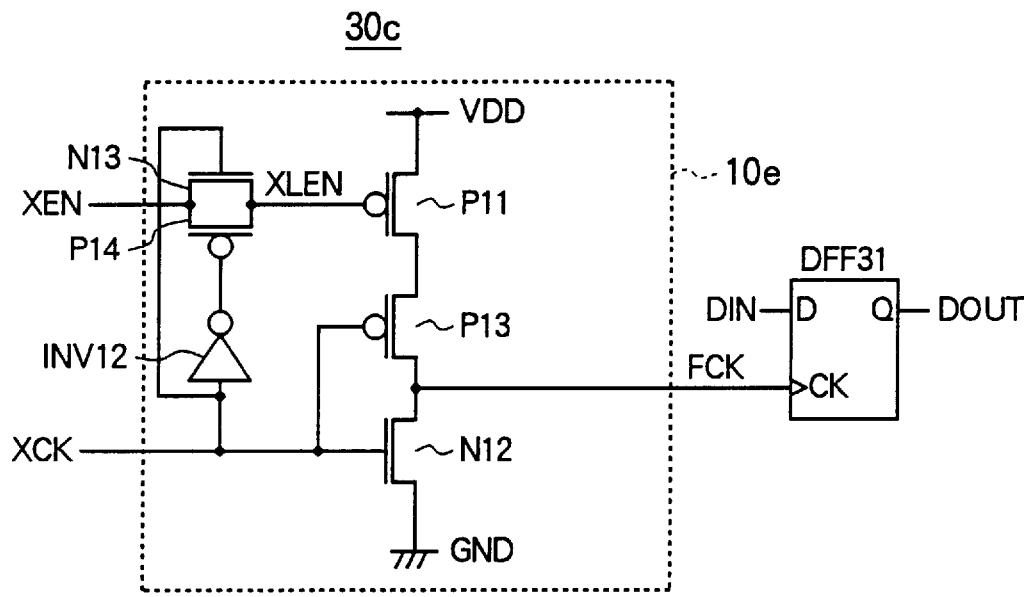
FIG. 28 is a circuit diagram of an 11th embodiment, that is, a circuit diagram of a D-type flip-flop equipped with an enable function adopting a function clock generation circuit according to the present invention.

FIG. 28 is a circuit diagram of an 11th embodiment, that is, a circuit diagram of another example of a D-type flip-flop equipped with an enable function adopting a function clock generation circuit according to the present invention.

In the 11th embodiment, a D-type flip-flop 30c equipped with an enable function is constituted by connecting the output terminal of the function clock generation circuit 10e obtained by deleting the inverter INV11 from the circuit of FIG. 18 (connection point of drains of the PMOS transistor P13 and the NMOS transistor N12) to the clock input terminal of the D-type flip-flop DFF31.

According to the 11th embodiment, an effect similar to the effect by the above eighth embodiment can be obtained.

12th Embodiment

Figure 29:
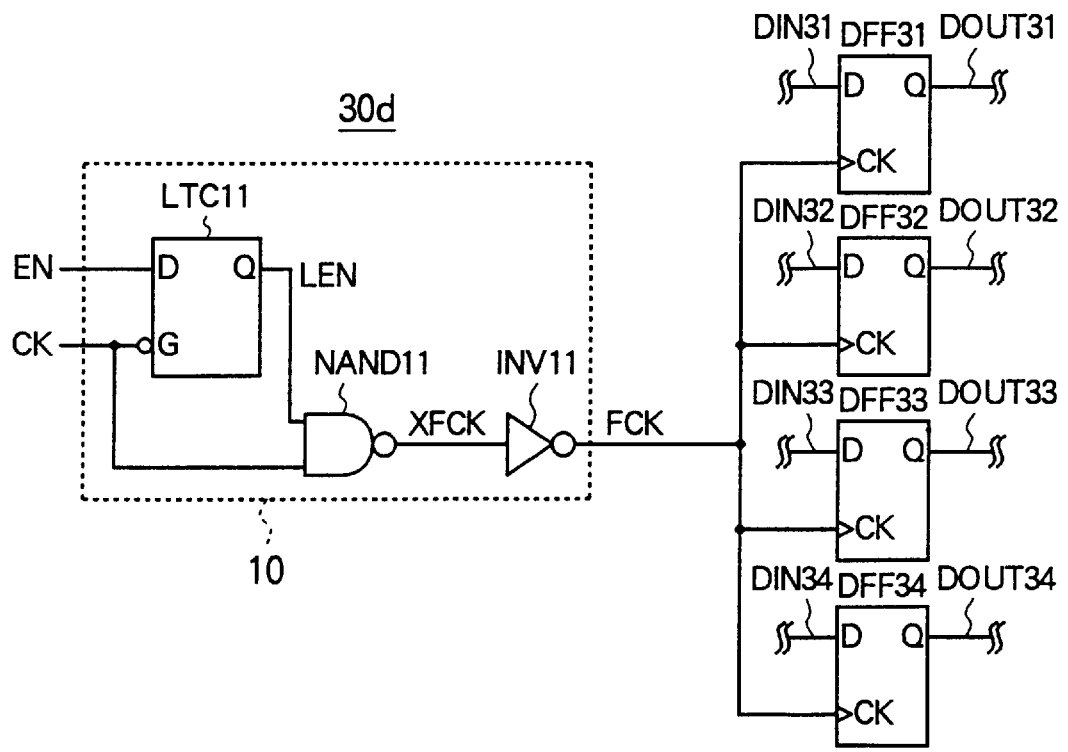
FIG. 29 is a circuit diagram of a 12th embodiment, that is, a circuit diagram of another example of a D-type flip-flop equipped with an enable function adopting a function clock generation circuit according to the present invention.

FIG. 29 is a circuit diagram of a 12th embodiment, that is, a circuit diagram of another example of a D-type flip-flop equipped with an enable function adopting a function clock generation circuit according to the present invention.

In the 12th embodiment, a D-type flip-flop 30d equipped with an enable function is constituted by connecting the output terminal of the inverter INV11, that is, the output terminal of the function clock generation circuit 10 shown in FIG. 11, to a plurality of clock input terminals, e.g., four D-type flip-flops DFF31 to 34 in the present embodiment.

Figure 30:
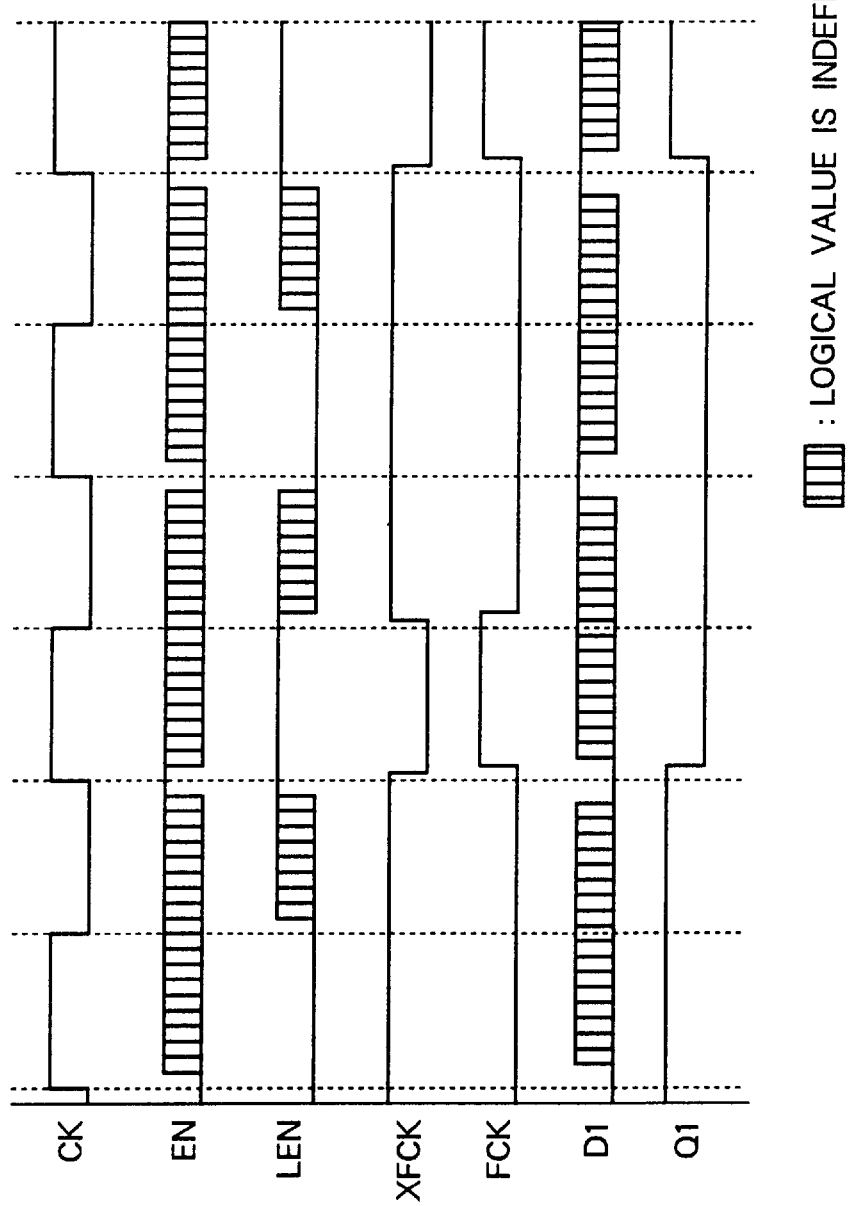
FIG. 30 is a timing chart of the operation of the circuit of FIG. 29.

FIG. 30 shows a timing chart of the operation of the circuit of FIG. 29.

In this circuit 30d, the enable signal EN is input to the through latch LTC11. In the section in which the clock signal CK is at the low level, it is propagated to the output terminal Q of the through latch LTC11 as it is.

In the section where the clock signal CK is at the high level, the value of the enable signal EN immediately before the clock signal CK becomes the high level is output to the node LEN. The signal of the node LEN is input to the NAND gate NAND11 together with the clock signal CK, whereby the function clock XFCK is generated. Then, this signal XFCK is inverted at the inverter INV11 and supplied as the function clock FCK to the clock input terminals of the D-type flip-flops DFF31 to 34.

According to the 12th embodiment, in contrast to the fact that in the related art, when the same enable signal EN is used in a plurality of synchronous D-type flip-flops equipped with enable functions as shown in FIG. 8, a number of selector circuits as shown in FIG. 6 corresponding to the number of the D-type flip-flops are necessary, one function clock generation circuit is sufficient, and it becomes unnecessary to distribute the enable signal EN to each D-type flip-flop, therefore the circuit size becomes small.

Further, as seen from the comparison of FIG. 30 and FIG. 7, in the present invention, only the required clock pulse is supplied to the D-type flip-flop according to the value of the enable signal EN, therefore there is no excess operation of the D-type flip-flop as in the conventional circuit and a low power consumption is achieved.

13th Embodiment

Figure 31:
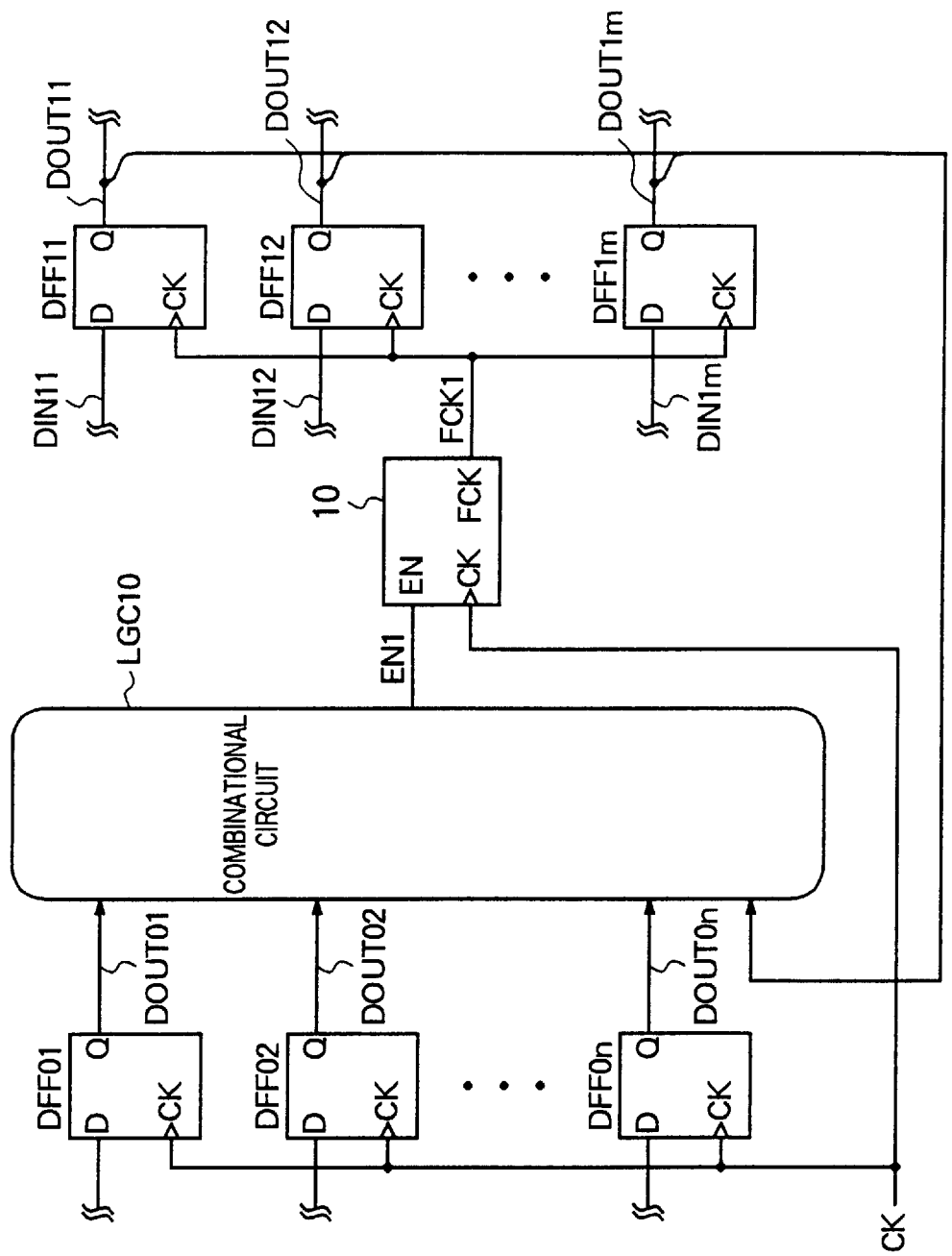
FIG. 31 is a circuit diagram of a 13th embodiment, that is, a circuit diagram of an example of a configuration where a function clock generation circuit according to the present invention is used in for example an LSI chip design system.

FIG. 31 is a circuit diagram of a 13th embodiment, that is, a circuit diagram of an example of a configuration where a function clock generation circuit according to the present invention is used in for example an LSI chip design system.

In this circuit, the enable signal EN1 is generated by processing the outputs of the D-type flip-flops DFF01 to DFF0n and DFF11 to DFF1m at the combinational circuit LGC10.

This enable signal EN1 is input to the function clock generation circuit 10. As mentioned above, the enable signal EN is sampled at the rising edge of the clock signal CK, and the positive pulse immediately after the rising of the clock signal CK is propagated to the output node or blocked according to the result thereof, thereby to generate the FCK1.

The thus generated function clock FCK1 is used as the clock of the D-type flip-flops DFF11 to DFF1m etc. of the later stage.

Further, in actuality, there also exists a case where a large number of function clock generation circuits 10 mentioned above are used in one LSI chip. In this case, a large number of enable signals having different signal values from the enable signal EN1 are simultaneously generated at the combinational circuit LGC10, and a function clock FCK corresponding to them is generated and used.

In this way, where a function clock generation circuit according to the present embodiment is used in the LSI chip design as shown in FIG. 31, the number of interconnections can be reduced in comparison with a circuit using a single phase clock and D-type flip-flop equipped with an enable function as shown in FIG. 5 which has been conventionally frequently used.

Further, since the D-type flip-flops equipped with enable functions can be replaced by the usual D-type flip-flops, it is possible to reduce the number of gates by the amount of the enable functions of the D-type flip-flops equipped with enable functdions shown in FIG. 3 and FIG. 6. By this, the chip area can be reduced.

Further, when comparing FIG. 31 and FIG. 5, the D-type flip-flops DFF11, DFF12, . . . , DFF1m of FIG. 31 driven by the function clock operate only when the enable signal is at the high level, therefore the power consumption is reduced to several tenths to several hundredths as in FIG. 5.

14th Embodiment

Figure 32:
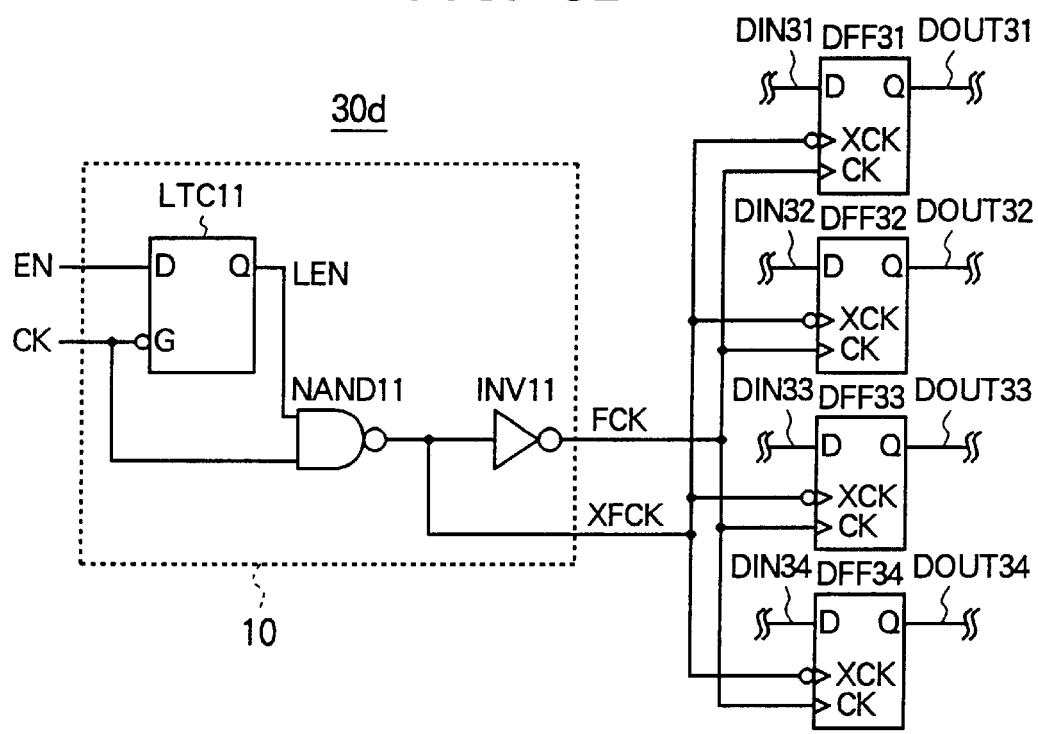
FIG. 32 is a circuit diagram of a 14th embodiment, that is, a circuit diagram of another example of a D-type flip-flop equipped with an enable function adopting a function clock generation circuit according to the present invention.

FIG. 32 is a circuit diagram of a 14 embodiment, that is, a circuit diagram of another example of the D-type flip-flop equipped with an enable function adopting a function clock generation circuit according to the present invention.

In the 14th embodiment, the D-type flip-flop corresponds to the case where not one, but two, that is, a positive and a negative, systems of clock signals CK are necessary, and the output terminal of the inverter INV11, that is, the output terminal of the function clock generation circuit 10 shown in FIG. 11, is connected to positive clock input terminals of a plurality of, in the present embodiment, four D-type flip-flops DFF31 to 34 and, the output terminal of the NAND gate NAND11 is connected to the negative clock input terminal, thereby to constitute the D-type flip-flop 30d equipped with an enable function.

According to the 14th embodiment, a similar effect to the effect by the above 12th embodiment can be obtained.

15th Embodiment

Figure 33:
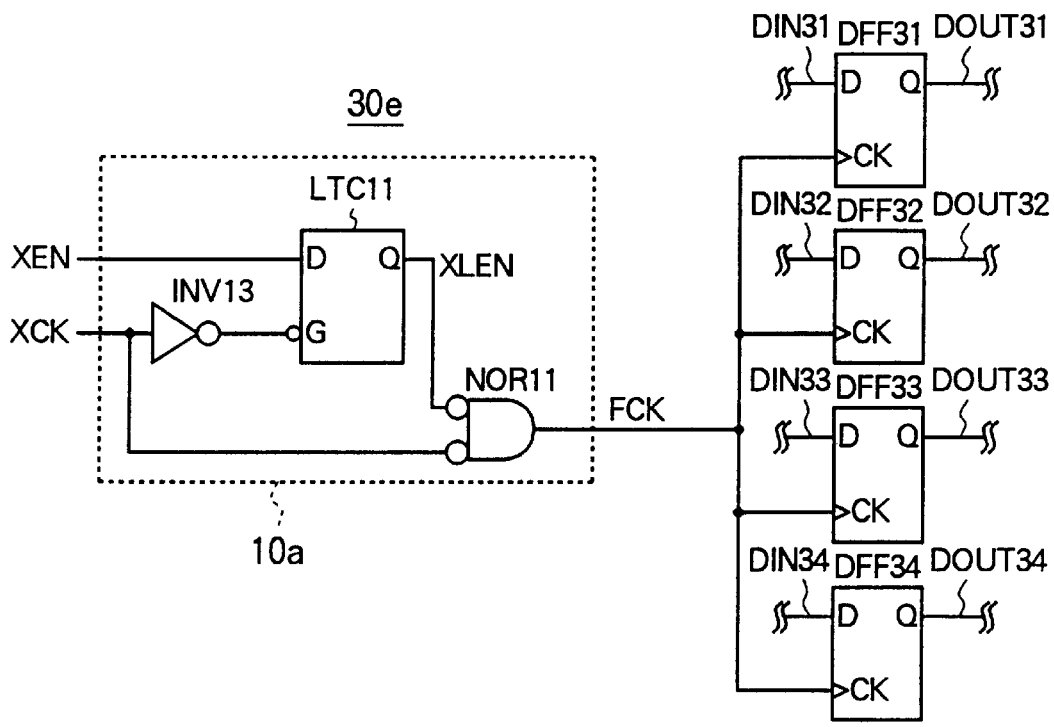
FIG. 33 is a circuit diagram of a 15th embodiment, that is, a circuit diagram of another example of a D-type flip-flop equipped with an enable function adopting a function clock generation circuit according to the present invention.

FIG. 33 is a circuit diagram of a 15th embodiment, that is, a circuit diagram of another example of the D-type flip-flop equipped with an enable function adopting a function clock generation circuit according to the present invention.

The 14th embodiment deals with the case where the enable signal EN and the clock signal CK have a negative logic, and the output terminal of the inverter INV11, that is, the output terminal of the function clock generation circuit 10 shown in FIG. 14, is connected to positive clock input terminals of a plurality of, in the present embodiment, four D-type flip-flops DFF31 to 34, thereby to constitute a D-type flip-flop 30e equipped with an enable function.

According to the 15th embodiment, a similar effect to the effect by the above 12th embodiment can be obtained.

16th Embodiment

Figure 34:
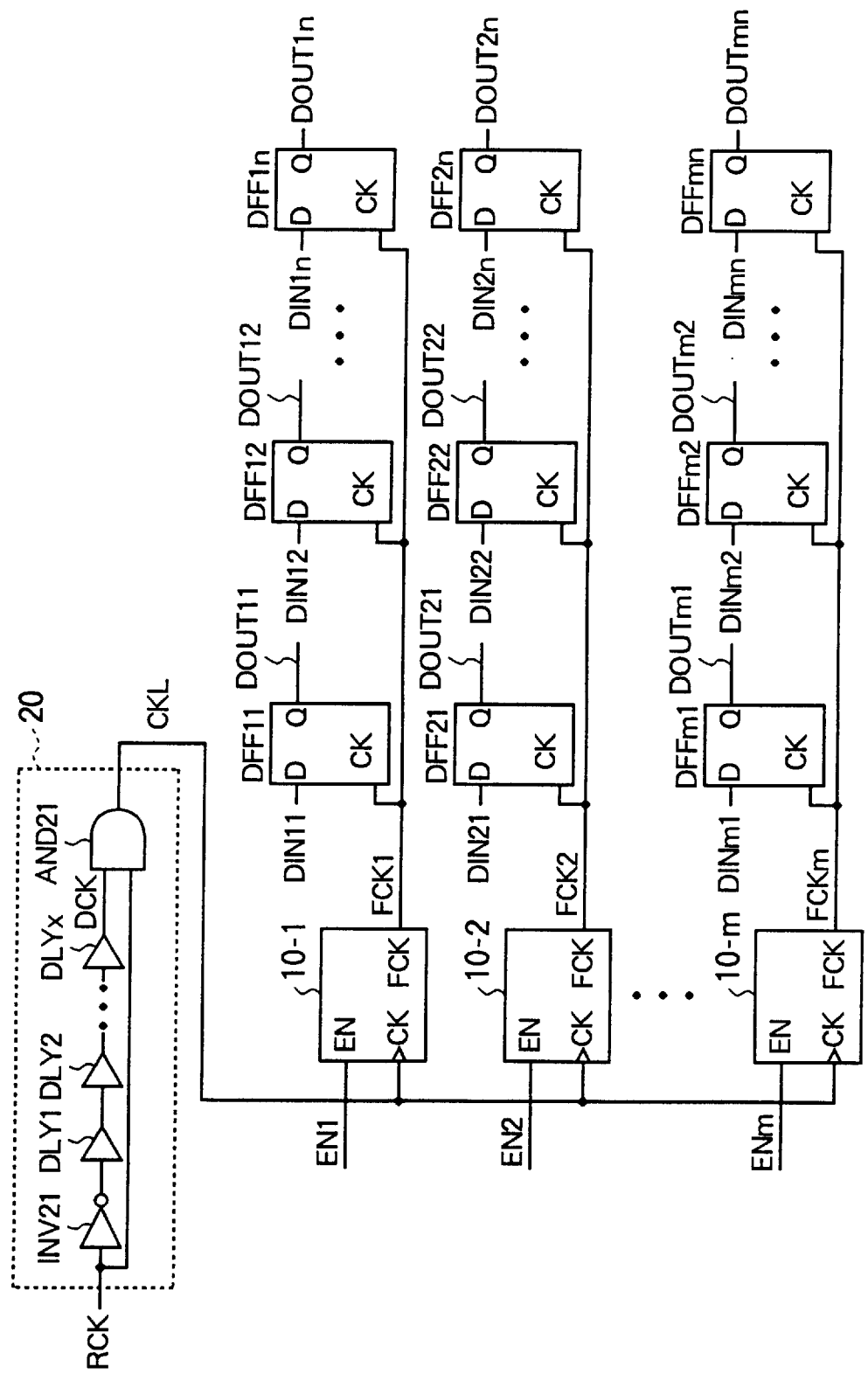
FIG. 34 is a circuit diagram of a 16th embodiment, that is, a circuit diagram of another example in which a pulse width limiting circuit is provided in a function clock generation circuit according to the present invention.

FIG. 34 is a circuit diagram of a 16th embodiment, that is, a circuit diagram of another example in which a pulse width limiting circuit is provided in a function clock generation circuit according to the present invention.

The 16th embodiment shows a case where the clock pulse width limiting circuit 20 for limiting the pulse width of the clock signal CK supplied to the function clock generation circuit 10 is provided similar to the above seventh embodiment.

The point of difference of the 16th embodiment from the seventh embodiment resides in that clock signals CKL limited in their pulse widths at the clock pulse width limiting circuit 20 are supplied in parallel to m number of function clock generation circuits 10-1 to 10-m, and further function clock signals FCK1, FCK2, . . . , FCKm generated at the function clock generation circuits 10-1 to 10-m are supplied in parallel to n number of D-type flip-flops DFF11 to DFF1n, DFF21 to DFF2n, . . . , DFFm1 to DFFmn, respectively.

Note that, the configuration and operation of the clock pulse width limiting circuit 20 are similar to those of the seventh embodiment explained by referring to FIG. 19 and FIG. 20, therefore an explanation thereof will be omitted here.

By combining this clock pulse width limiting circuit 20, when viewing this as a whole circuit, the restriction of the period for which the original clock is at high level due to the use of the above dynamic circuit can be eliminated, and it can be easily replaced by the circuit of FIG. 1 using the conventional synchronous D-type flip-flop equipped with an enable function and an equivalent operation can be realized.

According to the 16th embodiment, the maximum value of the period for which the signal value is dynamically held in the dynamic type small function clock generation circuits 10-1 to 10-m is guaranteed by the clock pulse width limiting circuit 20 and a pseudo static operation is performed, therefore there is an advantage that a low power consumption and reduction of surface area can be realized by making the function equivalent to that of the conventional synchronous D-type flip-flop equipped with an enable function.

17th Embodiment

Figure 35:
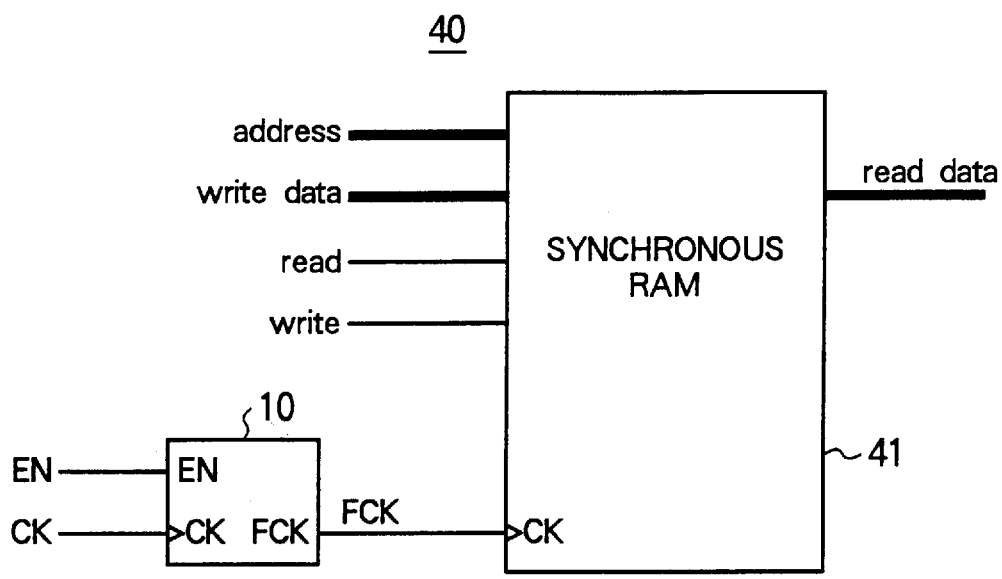
FIG. 35 is a circuit diagram of a 17th embodiment, that is, a circuit diagram of an example in which a function clock generation circuit according to the present invention is connected to a synchronous RAM and an enable function is added.

FIG. 35 is a circuit diagram of a 17th embodiment, that is, a circuit diagram of an example in which a function clock generation circuit according to the present invention is connected to a synchronous RAM having a clock input, and an enable function is added.

Specifically, it has a configuration in which the function clock FCK generated at the function clock generation circuit 10 is supplied to the clock input terminal CK of the synchronous RAM 41.

According to the 17th embodiment, there is an advantage that an enable function can be added by an increase of a small number of transistors by adding the function clock generation circuit of the present invention to the synchronous RAM.

Note that, the 17th embodiment was explained by taking as an example a synchronous RAM, but is not restricted to this. Various modifications are possible, for example, another memory circuit having a clock input, for example, a circuit in which a synchronous ROM, synchronous PLA, or the like is connected.

18th Embodiment

Figure 36:
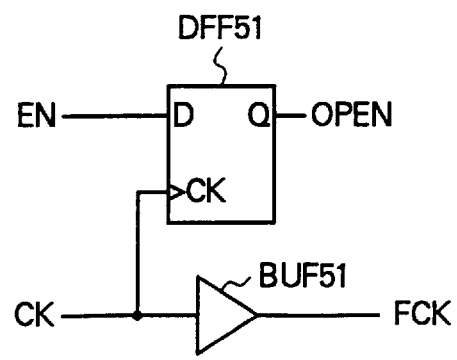
FIG. 36 is a circuit diagram of an 18th embodiment, that is, a view showing the concept of a static timing analysis use model as a combination of the models of the already existing D-type flip-flop and buffer.

FIG. 36 is a view of the configuration of a static timing analysis model corresponding to claims 1, 2, and 4 and shows the concept of the static timing analysis use model as a combination of the already existing model of the D-type flip-flop DFF51 and the buffer BUF51.

Here, the static timing analysis use model is for the function clock generation circuit mentioned above.

Specifically, the model of the route from the clock input to the function clock output is the same as a simple buffer or inverter. For the enable signal, the set time and holding time are examined with respect to the time of change of the rising edge of the clock input signal. For the route reaching the output of the cell from the output of the through latch, it is regarded as a no delay propagation route.

If use is made not of a model configuration following an actual circuit as it is, but a static timing analysis use model, irrespective of the utilization of the function clock, the check of the operation speed of the entire circuit, holding time of the D-type flip-flop, critical path, etc. can be easily performed by the static timing analysis software.

This is for the following reason.

Figure 13:
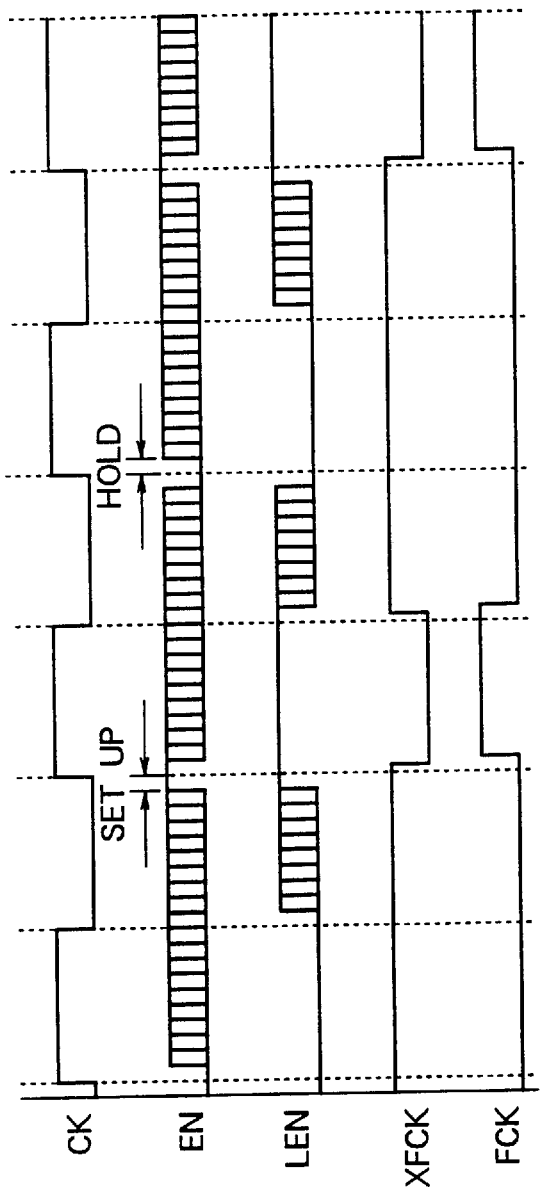
FIG. 13 is a timing chart common to the circuits of FIGS. 11 and 12.

In the function clock generation circuit according to the present invention, as seen from the circuits of FIG. 11 and FIG. 12 and the timing chart of FIG. 13, when viewing the overall circuit, it can be regarded that the enable signal EN is sampled at the rising edge of the clock signal CK.

For this reason, in the timing analysis model of the present invention, as shown in FIG. 36, the setting and holding time of the enable signal EN with respect to the clock signal shown in FIG. 13 are checked by using the already existing model of D-type flip-flop DFF51, and the timing verification of the function clock generation circuit is guaranteed by this.

Further, also the problem of selection of the clock propagation delay path is solved by ignoring the unrequired path and replacing the gate portion by the model of the simple buffer BUF51 as shown in FIG. 36.

When the present static timing analysis use model is used for the above reason, irrespective of the utilization of the function clock, the check of the operation speed of the entire circuit, holding time of the D-type flip-flop, critical path, etc. can be easily carried out by the static timing analysis software.

As explained above, according to the present invention, the enable signal is sampled at for example the rising edge of the clock signal and the clock pulse immediately after this can be passed or blocked in a small delay time.

Further, by using this function clock generation circuit, it becomes possible to easily replace a circuit using a single single-phase clock and D-type flip-flop equipped with an enable function, which has been conventionally frequently used, by an equivalent circuit using a function clock and also the interconnection area and cell area and further the power consumption can be reduced. Further, by using an adequate static timing analysis model corresponding to the function clock generation circuit of the present invention, the timing verification can be adequately carried out.

What is claimed is:

1. A function clock generation circuit comprising:
   a through latch receiving an enable signal and an input clock signal, said through latch transferring the enable signal as it is when the input clock signal is in a first state and for capturing and outputting the enable signal of the point of time immediately before the input clock signal changes from the first state to a second state while the input clock signal is in the second state; and
   a logical circuit receiving said input clock signal and said enable signal captured and output from said through latch, said logic circuit outputting a function clock signal of the second state only when the output signal of said through latch is in the second state and the input clock signal is in the second state and outputting a function clock sigal of the first state when the output signal of the through latch is in the first state and the input clock signal is in the second state or when the output signal of the through latch is in the first state and the input clock is in the first state.

2. The function clock generation circuit according to claim 1, wherein said through latch is constituted by a dynamic type latch provided with a transfer gate for transferring said enable signal as it is when the input clock signal is in the first state and for capturing and outputting the enable signal of the point of time immediately before the input clock signal changes from the first state to a second state while the input clock signal is in the second state to said first node.

3. The function clock generation circuit according to claim 1, having a clock pulse width limiting circuit for limiting the maximum pulse width of the clock signal and supplying this to said through latch and logical circuit.

4. The function clock generation circuit according to claim 1,
   wherein said logical circuit includes a first means for connecting a second node to a first power source when the input clock signal is in the first state and a second means for connecting said second node to a second power source only when the input clock signal is in the second state and the signal of said first node is in the second state.

5. The function clock generation circuit according to claim 4, having a clock pulse width limiting circuit for limiting the maximum pulse width of the clock signal and supplying this to said through latch and logical circuit.

6. A D-type flip-flop equipped with an enable function comprising:
   at least one D-type flip-flop stage including a clock input terminal; and
   a function clock generation stage, said function clock generation stage including
      a through latch receiving an enable signal and an input clock signal, said through latch transferring the enable signal as it is when the input clock signal is in a first state and for capturing and outputting the enable signal of the point of time immediately before the input clock signal changes from the first state to a second state while the input clock signal is in the second state, and
      a logical circuit receiving said input clock signal and said enable signal captured and output from said through latch, said logic circuit outputting a function clock signal of the second state only when the output signal of said through latch is in the second state and the input clock signal is in the second state and outputting a function clock signal of the first state when the output signal of the through latch is in the first state and the input clock signal is in the second state or when the output signal of the through latch is in the first state and the input clock is in the first state,
      wherein a first output terminal of said logical circuit is connected to said clock input terminal of said D-type flip-flop stage.

7. The D-type flip-flip equipped with an enable function according to claim 6, wherein said D-type flip-flop stage is constituted by connecting a dynamic type latch and a static type latch in cascade.

8. A D-type flip-flop equipped with an enable function comprising:

at least one D:type flip-flop stage including a clock input terminal;

a clock pulse width limiting stage for limiting the maximum pulse width of an input clock pulse; and a function clock generation stage connected to said D-type flip-flop stage and said clock pulse width limiting stage, said function clock generation stage including a through latch receiving an enable signal and an input clock signal, said through latch transferring the enable signal as it is when the input clock signal is in a first state and for capturing and outputting the enable signal of the point of time immediately before the input clock signal changes from the first state to a second state while the input clock signal is in the second state, and a logical circuit receiving said input clock signal and said enable signal captured and output from said through latch, said logic circuit outputting a function clock signal of the second state only when the output signal of said through latch is in the second state and the input clock signal is in the second state and outputting a function clock signal of the first state when the output signal of the through latch is in the first state and the input clock signal is in the second state or when the output signal of the through latch is in the first state and the input clock is in the first state, wherein an output terminal of said logical circuit is connected to said clock input terminal of said D-type flip-flop stage.

9. The D-type flip-flip equipped with an enable function according to claim 8, wherein said D-type flip-flop stage is constituted by connecting a dynamic type latch and a static type latch in cascade.

10. A memory device comprising:

at least one memory element having a clock input terminal; and a function clock generation circuit, said function clock generation circuit including a through latch receiving an enable signal and an input clock signal, said through latch transferring the enable signal as it is when the input clock signal is in a first state and for capturing and outputting the enable signal of the point of time immediately before the input clock signal changes from the first state to a second state while the input clock signal is in the second state, and a logical circuit receiving said input clock signal and said enable signal captured and output from said through latch, said logic circuit outputting a function clock signal of the second state only when the output signal of said through latch is in the second state and the input clock signal is in the second state and outputting a function clock signal of the first state when the output signal of the through latch is in the first state and the input clock signal is in the second state or when the output signal of the through latch is in the first state and the input clock is in the first state, wherein an output terminal of said logical circuit is connected to said clock input terminal of said memory element.

11. The function clock generation circuit according to claim 4, wherein said first means is constituted by a PMOS transistor and a NMOS transistor and said second means is constituted by a NMOS transistor.

12. The function clock generation circuit according to claim 4, wherein said first means is constituted by a PMOS transistor and a NMOS transistor and said second means is constituted by a PMOS transistor.

13. The function clock generation circuit according to claim 2, wherein said transfer gate is constituted by a NMOS transistor.

14. The function clock generation circuit according to claim 2, wherein said transfer gate is constituted by a PMOS transistor and a NMOS transistor.

15. The function clock generation circuit according to claim 2, wherein said transfer gate is constituted by a PMOS transistor.

16. The function clock generation circuit according to claim 1, wherein said logical circuit is a NAND gate connected to an inverter.

17. The function clock generation circuit according to claim 1, wherein said logical circuit is a NOR gate.

18. The D-type flip-flop according to claim 6 comprising a plurality of said D-type flip-flop stages.

19. The D-type flip-flop according to claim 6, wherein said D-type flip-flop stage further includes an inverted clock input terminal connected to a second output terminal for inverting said function clock signal.

* * * * *

UNITED STATES PATENT AND TRADEMARK OFFICE
CERTIFICATE OF CORRECTION

PATENT NO. : 5,883,529
DATED : March 16, 1999
INVENTOR(S) : Ichiro KUMATA and Masatoshi AIKAWA It is certified that error appears in the above-identified patent and that said Letters Patent is hereby corrected as shown below:

Claim 1 should read:

-- 1. A function clock generation circuit comprising:

a through latch receiving an enable signal and an input clock signal, said through latch transferring the enable signal as it is when the input clock signal is in a first state and for capturing and outputting the enable signal of the point of time immediately before the input clock signal changes from the first state to a second state while the input clock signal is in the second state; and a logical circuit receiving said input clock signal and said enable signal captured and output from said through latch, said logic circuit outputting a function clock signal of the second state only when the output signal of said through latch is in the second state and the input clock signal is in the second state and outputting a function clock signal of the first state when the output signal of the through latch is

UNITED STATES PATENT AND TRADEMARK OFFICE
CERTIFICATE OF CORRECTION

PATENT NO.   :   5,883,529
DATED        :   March 16, 1999
INVENTOR(S)  :   Ichiro KUMATA and Masatoshi AIKAWA It is certified that error appears in the above-identified patent and that said Letters Patent is hereby corrected as shown below:

in the first state and the input clock signal is in the second state or when the output signal of the through latch is in the first state and the input clock signal is in the first state.

Signed and Sealed this

Seventh Day of September, 1999

*Attest:*

Q. TODD DICKINSON

*Attesting Officer*       *Acting Commissioner of Patents and Trademarks*